(12) United States Patent
Cheng et al.

(10) Patent No.: US 12,190,801 B2
(45) Date of Patent: *Jan. 7, 2025

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yudiao Cheng, Beijing (CN); Benlian Wang, Beijing (CN); Yao Huang, Beijing (CN); Weiyun Huang, Beijing (CN); Lili Du, Beijing (CN); Yue Long, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/385,071

(22) Filed: Oct. 30, 2023

(65) Prior Publication Data
US 2024/0062717 A1    Feb. 22, 2024

Related U.S. Application Data

(63) Continuation of application No. 17/609,878, filed as application No. PCT/CN2020/119673 on Sep. 30, 2020, now Pat. No. 11,862,081.

(51) Int. Cl.
G09G 3/20        (2006.01)
G09G 3/3225    (2016.01)
(Continued)

(52) U.S. Cl.
CPC ........ *G09G 3/3225* (2013.01); *G09G 3/3233* (2013.01); *G09G 3/3275* (2013.01);
(Continued)

(58) Field of Classification Search
CPC .. G09G 3/3225; G09G 3/3233; G09G 3/3275; G09G 2300/0413;
(Continued)

(56) References Cited

U.S. PATENT DOCUMENTS 10,707,281 B2    7/2020  Kuo et al.
11,727,849 B2    8/2023  Lu et al.
(Continued)

FOREIGN PATENT DOCUMENTS

CN        209731298 U     12/2019

OTHER PUBLICATIONS

Non-final office Action of U.S. Appl. No. 17/423,885 issued on Feb. 15, 2024.
(Continued)

*Primary Examiner* — Jennifer T Nguyen
(74) *Attorney, Agent, or Firm* — Lippes Mathias LLP

(57) ABSTRACT

The present disclosure discloses a display panel and a display device. The display panel includes a base substrate including a first display region and a second display region. Since pixel circuits for driving light-emitting elements in the second display region are only disposed in the first display region but not disposed in the second display region, the light transmittance of the second display region is ensured to be good. Correspondingly, the display panel in the present disclosure has a good display effect.

20 Claims, 44 Drawing Sheets

(51) Int. Cl.
*G09G 3/3233* (2016.01)
*G09G 3/3275* (2016.01)
*H10K 50/86* (2023.01)
*H10K 59/121* (2023.01)
*H10K 59/131* (2023.01)
*H10K 59/35* (2023.01)
*H10K 59/65* (2023.01)
*H10K 59/88* (2023.01)
*H10K 71/00* (2023.01)
*H10K 59/12* (2023.01)

(52) U.S. Cl.
CPC ......... *H10K 50/865* (2023.02); *H10K 59/121* (2023.02); *H10K 59/1213* (2023.02); *H10K 59/1216* (2023.02); *H10K 59/131* (2023.02); *H10K 59/351* (2023.02); *H10K 59/65* (2023.02); *H10K 59/88* (2023.02); *H10K 71/00* (2023.02); *H10K 71/621* (2023.02); *G09G 2300/0413* (2013.01); *G09G 2300/0426* (2013.01); *G09G 2300/0819* (2013.01); *G09G 2300/0842* (2013.01); *G09G 2310/0272* (2013.01); *G09G 2310/08* (2013.01); *H10K 59/1201* (2023.02); *H10K 59/353* (2023.02)

(58) Field of Classification Search
CPC ... G09G 2300/0426; G09G 2300/0819; G09G 2300/0842; G09G 2310/0272; G09G 2310/08; H10K 59/131; H10K 59/65; H10K 71/00; H10K 59/1213; H10K 50/865; H10K 59/1216; H10K 59/353; H10K 59/1201

USPC ......................................................... 345/55
See application file for complete search history.

(56) References Cited

U.S. PATENT DOCUMENTS

| | | |
|---|---|---|
| 11,810,504 B2 | 11/2023 | Cheng et al. |
| 11,810,505 B2 | 11/2023 | Lee et al. |
| 11,862,081 B2 * | 1/2024 | Cheng .................. H10K 50/865 |
| 2013/0083080 A1 | 4/2013 | Rappoport et al. |
| 2016/0358576 A1 | 12/2016 | Lee et al. |
| 2018/0366066 A1 | 12/2018 | Kim et al. |
| 2020/0052048 A1 * | 2/2020 | Kuo ...................... H10K 59/123 |
| 2020/0411610 A1 | 12/2020 | Zhang |
| 2021/0043135 A1 | 2/2021 | Zhao et al. |
| 2021/0090501 A1 * | 3/2021 | Wu ........................ G09G 3/3258 |
| 2022/0069047 A1 * | 3/2022 | Yang ...................... H10K 59/88 |
| 2022/0189394 A1 * | 6/2022 | Yang ...................... G09G 3/2003 |
| 2022/0343862 A1 | 10/2022 | Cheng et al. |
| 2022/0376000 A1 | 11/2022 | Du et al. |
| 2022/0376015 A1 | 11/2022 | Cheng et al. |

OTHER PUBLICATIONS

Non-final office Action of U.S. Appl. No. 17/427,151 issued on Mar. 14, 2024.

Non-final office Action of U.S. Appl. No. 18/477,479 issued on May 3, 2024.

* cited by examiner

| | | | | | | | | | | | A1 | A2 | |
|---|---|---|---|---|---|---|---|---|---|---|---|---|---|
| R | G1 | R | G1 | R | G1 | Second pixel circuit 20 | R | G1 | R | G1 | Second pixel circuit 20 | Second light-emitting element 40 | Second light-emitting element 40 |
| B | G2 | B | G2 | B | G2 | | B | G2 | B | G2 | | | |
| R | G1 | R | G1 | R | G1 | Second pixel circuit 20 | R | G1 | R | G1 | Second pixel circuit 20 | Second light-emitting element 40 | Second light-emitting element 40 |
| B | G2 | B | G2 | B | G2 | | B | G2 | B | G2 | | | |
| R | G1 | R | G1 | R | G1 | Second pixel circuit 20 | R | G1 | R | G1 | Second pixel circuit 20 | Second light-emitting element 40 | Second light-emitting element 40 |
| B | G2 | B | G2 | B | G2 | | B | G2 | B | G2 | | | |
| R | G1 | R | G1 | R | G1 | Second pixel circuit 20 | R | G1 | R | G1 | Second pixel circuit 20 | Second light-emitting element 40 | Second light-emitting element 40 |
| B | G2 | B | G2 | B | G2 | | B | G2 | B | G2 | | | |
| R | G1 | R | G1 | R | G1 | Second pixel circuit 20 | R | G1 | R | G1 | Second pixel circuit 20 | Second light-emitting element 40 | Second light-emitting element 40 |
| B | G2 | B | G2 | B | G2 | | B | G2 | B | G2 | | | |
| R | G1 | R | G1 | R | G1 | Second pixel circuit 20 | R | G1 | R | G1 | Second pixel circuit 20 | Second light-emitting element 40 | Second light-emitting element 40 |
| B | G2 | B | G2 | B | G2 | | B | G2 | B | G2 | | | |
| R | G1 | R | G1 | R | G1 | Second pixel circuit 20 | R | G1 | R | G1 | Second pixel circuit 20 | Second light-emitting element 40 | Second light-emitting element 40 |
| B | G2 | B | G2 | B | G2 | | B | G2 | B | G2 | | | |

FIG. 3

DISPLAY PANEL AND DISPLAY DEVICE

CROSS-REFERENCE TO RELATED APPLICATION

The present application is a continuation of U.S. patent application Ser. No. 17/609,878, filed on Nov. 9, 2021, which is a 371 of PCT Application No. PCT/CN2020/119673, filed on Sep. 30, 2020, all of which are hereby incorporated by reference in their entireties for all purposes

TECHNICAL FIELD

The present disclosure relates to the field of display technologies, and in particular to a display panel and a display device.

BACKGROUND

The under-screen camera technology is a new technology proposed to increase the screen-to-body ratio of display devices.

In the related art, a display panel with an under-screen camera generally includes a first display region for normal display and a second display region for arranging the camera. The second display region generally includes a plurality of light-emitting elements and a plurality of pixel circuits. Each pixel circuit is connected to one light-emitting element, and is used for driving the light-emitting element to emit light. The pixel circuit and the light-emitting element connected to each other are overlapped in a direction perpendicular to the display panel.

Because the second display region further includes the pixel circuit in the related art, the light transmittance of the second display region is poor, and correspondingly, the display panel has a poor display effect.

SUMMARY

The present disclosure provides a display panel and a display device. The technical solutions are as follows.

According to an aspect, a display panel is provided. The display panel includes:
- a base substrate including a first display region and a second display region, wherein the first display region at least partially disposed around the second display region;
- a plurality of first pixel circuits, a plurality of second pixel circuits, and a plurality of first light-emitting elements, wherein the plurality of first pixel circuits, the plurality of second pixel circuits, and the plurality of first light-emitting elements are disposed in the first display region, and the plurality of second pixel circuits are disposed at intervals among the plurality of first pixel circuits; and
- a plurality of second light-emitting elements disposed in the second display region;
- wherein at least one first pixel circuit of the plurality of first pixel circuits is connected to at least one first light-emitting element of the plurality of first light-emitting elements, an orthographic projection of the at least one first pixel circuit on the base substrate is at least partially overlapped with an orthographic projection of the at least one first light-emitting element on the base substrate, and at least one second pixel circuit of the plurality of second pixel circuits is connected to at least one second light-emitting element of the plurality of second light-emitting elements by a conductive trace.

Optionally, a density of the plurality of second light-emitting elements is the same as a density of the plurality of first light-emitting elements.

Optionally, a resolution of the first display region is the same as a resolution of the second display region; or, a resolution of the first display region is different from a resolution of the second display region.

Optionally, each of the plurality of the first pixel circuits is connected to one of the plurality of the first light-emitting elements; and
- an orthographic projection of each of the plurality of the first pixel circuits on the base substrate is at least partially overlapped with an orthographic projection of the connected first light-emitting element on the base substrate.

Optionally, the plurality of first pixel circuits include a plurality of columns of first pixel circuits extending in a first direction, and the plurality of second pixel circuits include a plurality of columns of second pixel circuits extending in the first direction;
- wherein the plurality of columns of second pixel circuits are disposed at intervals among the plurality of columns of first pixel circuits.

Optionally, an equal number or an unequal number of first pixel circuits are arranged between any two adjacent columns of the second pixel circuits.

Optionally, the plurality of first pixel circuits include a plurality of rows of first pixel circuits extending in a second direction, and the plurality of second pixel circuits include a plurality of rows of second pixel circuits extending in the second direction, where the second direction is intersected with the first direction; where the plurality of rows of second pixel circuits are disposed at intervals among the plurality of rows of first pixel circuits.

Optionally, the first direction is perpendicular to the second direction.

Optionally, the first display region includes a first sub-display region and a second sub-display region sequentially arranged in the first direction; wherein the first sub-display region includes two symmetrical target sub-display regions;
- wherein one target sub-display region, the second display region, and the other target sub-display region are sequentially arranged in the second direction.

Optionally, the second display region includes two third sub-display regions symmetrically arranged in the second direction; and the display panel includes a first conductive trace, a second conductive trace, and a third conductive trace; wherein
- each of the two third sub-display regions includes k light-emitting element groups, wherein each of the k light-emitting element groups includes a plurality of columns of adjacent second light-emitting elements, and a first light-emitting element group to a $k^{th}$ light-emitting element group are sequentially arranged in a direction going towards the other third sub-display region, k being an integer greater than 0; and
- each of the two target sub-display regions includes k pixel circuit groups in one to one correspondence with the k light-emitting element groups, wherein each of the k pixel circuit groups includes a plurality of columns of adjacent second pixel circuits, and a first pixel circuit group to a $k^{th}$ pixel circuit group are sequentially arranged in a direction going away from the adjacent third sub-display region; and the second light-emitting elements in each light-emitting element group are connected to the second pixel circuits in the corresponding pixel circuit group by the first conductive traces, and/or the second conductive traces, and/or the third conductive traces in one-to-one correspondence.

Optionally, k is 4.

Optionally, the second light-emitting elements in the first light-emitting element group are connected to the second pixel circuits in the first pixel circuit group by the first conductive traces in one-to-one correspondence;

the second light-emitting elements in a second light-emitting element group are connected to the second pixel circuits in a second pixel circuit group by the second conductive traces in one-to-one correspondence;

the second light-emitting elements in a third light-emitting element group are connected to the second pixel circuits in a third pixel circuit group by the third conductive traces in one-to-one correspondence; and the second light-emitting elements in a fourth light-emitting element group are connected to the second pixel circuits in a fourth pixel circuit group by one of the first conductive traces, the second conductive traces, and the third conductive traces in one-to-one correspondence.

Optionally, each of the first conductive traces connected to the second light-emitting elements in the first light-emitting element group, the second conductive trace connected to the second light-emitting elements in the second light-emitting element group, and the third conductive trace connected to the second light-emitting elements in the third light-emitting element group includes a first conductive trace segment, a second conductive trace segment, and a third conductive trace segment; wherein one end of the first conductive trace segment is connected to a corresponding second light-emitting element, and the other end of the first conductive trace segment is connected to one end of the second conductive trace segment;

the other end of the second conductive trace segment is connected to one end of the third conductive trace segment; and the other end of the third conductive trace segment is connected to a corresponding second pixel circuit; and the first conductive trace segment and the third conductive trace segment extend in the first direction, the second conductive trace segment extends in the second direction, and an orthographic projection of the second conductive trace segment on the base substrate is at least partially overlapped with an orthographic projection of the second light-emitting element connected to the second conductive trace segment on the base substrate.

Optionally, the second conductive trace segment in the first conductive trace is at least partially overlapped with the second conductive trace segment in the third conductive trace, the second conductive trace segment in the first conductive trace is not overlapped with the second conductive trace segment in the second conductive trace, and the second conductive trace segment in the third conductive trace is not overlapped with the second conductive trace segment in the second conductive trace.

Optionally, the fourth light-emitting element group includes two first sub-light-emitting element groups, two second sub-light-emitting element groups, and two third sub-light-emitting element groups symmetrically arranged along an axis of the third sub-display region, wherein each of the sub-light-emitting element groups includes a plurality of rows of adjacent second light-emitting elements adjacent to each other, the first sub-light-emitting element group, the second sub-light-emitting element group, and the third sub-light-emitting element group disposed on a same side are sequentially arranged in a direction going away from the axis, and the axis extends in the second direction; and the fourth pixel circuit group includes two first sub-pixel circuit groups in one-to-one correspondence with the two first sub-light-emitting element groups, two second sub-pixel circuit groups in one-to-one correspondence with the two second sub-light-emitting element groups, and two third sub-pixel circuit groups in one-to-one correspondence with the two third sub-light-emitting element groups;

wherein the second light-emitting elements in each of the two first sub-light-emitting element groups are connected to the second pixel circuits in a corresponding first sub-pixel circuit group by the first conductive traces in one-to-one correspondence; the second light-emitting elements in each of the second sub-light-emitting element groups are connected to the second pixel circuits in a corresponding second sub-pixel circuit group by the second conductive traces in one-to-one correspondence; and the second light-emitting elements in each of the third sub-light-emitting element group are connected to the second pixel circuits in a corresponding third sub-pixel circuit group by the third conductive traces in one-to-one correspondence.

Optionally, each of the first conductive traces connected to the second light-emitting element in each of the two first sub-light-emitting element groups, the second conductive trace connected to the second light-emitting elements in each of the two second sub-light-emitting element groups, and the third conductive trace connected to the second light-emitting elements in each of the two third sub-light-emitting element groups includes a fourth conductive trace segment, a fifth conductive trace segment, a sixth conductive trace segment, and a seventh conductive trace segment; wherein one end of the fourth conductive trace segment is connected to a corresponding second light-emitting element, and the other end of the fourth conductive trace segment is connected to one end of the fifth conductive trace segment;

the other end of the fifth conductive trace segment is connected to one end of the sixth conductive trace segment;

the other end of the sixth conductive trace segment is connected to one end of the seventh conductive trace segment; and the other end of the seventh conductive trace segment is connected to a corresponding second pixel circuit;

the fifth conductive trace segment and the seventh conductive trace segment extend in the first direction, and the sixth conductive trace segment extends in the second direction; and the fourth conductive trace segment is disposed between a row of the connected second light-emitting element and an adjacent row; and the fifth conductive trace segment in the first conductive trace is disposed in a region in which the second light-emitting element group to the fourth light-emitting element group are disposed, the fifth conductive trace segment in the second conductive trace is disposed in a region in which the third light-emitting element group and the fourth light-emitting element group are disposed, and the fifth conductive trace segment in the third conductive trace is disposed in a region in which the fourth light-emitting element group is disposed; and the sixth conductive trace segment on a side, distal from the second sub-display region, of the axis, is disposed on a side, distal from the second sub-display region, of the second display region, and the sixth conductive trace segment on a side, proximal to the second sub-display region, of the axis is disposed in the second display region proximal to the second sub-display region.

Optionally, each of the first light-emitting element group to the third light-emitting element group includes 12 columns of second light-emitting elements; and the fourth light-emitting element group includes 8 columns of second light-emitting elements; and each of the first pixel circuit group to the third pixel circuit group includes 12 columns of second pixel circuits; and the fourth pixel circuit group includes 8 columns of second pixel circuits.

Optionally, the display panel further includes a plurality of metal layers; wherein a data trace connected to each of the second pixel circuits and any of the plurality of metal layers are disposed in the same layer;

wherein the plurality of metal layers include a first gate metal layer, a second gate metal layer, a first source-drain metal layer, and a second source-drain metal layer.

Optionally, in the direction going away from the adjacent third sub-display region, in the first column to an $i^{th}$ column of second pixel circuits in each of the two target sub-display regions, a data trace connected to the second pixel circuits disposed in an odd-numbered column and the first gate metal layer are disposed in the same layer; a data trace connected to the second pixel circuits disposed in an even-numbered column and the second gate metal layer are disposed in the same layer; and a data trace connected to the $i^{th}$ column to an $n^{th}$ column of second pixel circuits and the first source-drain metal layer are disposed in the same layer, wherein i is an integer greater than 1 and less than n, and n is equal to a total quantity of columns in each of the two target sub-display regions.

Optionally, a data trace connected to each second pixel circuit includes a first data trace segment, a second data trace segment, and a third data trace segment; wherein one end of the first data trace segment is connected to a corresponding metal layer, the other end of the first data trace segment is connected to one end of the second data trace segment, the other end of the second data trace segment is connected to one end of the third data trace segment, and the other end of the third data trace segment is connected to the second pixel circuit; and the second data trace segment extends in the first direction, and the second data trace segment in the data trace in the same layer as the first gate metal layer, the second data trace segment in the data trace in the same layer as the second gate metal layer, and the second data trace segment in the data trace in the same layer as the first source-drain metal layer are not overlapped with each other.

Optionally, the first gate metal layer, the second gate metal layer, and the first source-drain metal layer are covered by the second source-drain metal layer.

Optionally, in the same column of the second pixel circuits, the data trace connected to the second pixel circuits disposed in the first sub-display region is different from the data trace connected to the second pixel circuits disposed in the second sub-display region.

Optionally, the display panel further includes at least one column of dummy second pixel circuits, wherein the at least one column of dummy second pixel circuits is disposed in the target sub-display region proximal to the second display region.

Optionally, in the plurality of first pixel circuits and the plurality of second pixel circuits, a width of any pixel circuit is less than a width of any first light-emitting element.

Optionally, a difference between the width of each pixel circuit and the width of the first light-emitting element is 4 micrometers.

Optionally, each of each second pixel circuit and each second light-emitting element is provided with a connecting member, wherein the conductive trace is separately connected to the connecting member of the at least one second pixel circuit and the connecting member of the at least one second light-emitting element.

Optionally, the conductive trace is a transparent conductive trace.

Optionally, a material of the transparent conductive trace is indium tin oxide.

Optionally, the second display region is a light-transmitting display region.

According to another aspect, a display device is provided. The display device includes: an integrated circuit and the display panel as defined in the foregoing aspect; wherein the integrated circuit is connected to a first pixel circuit and a second pixel circuit in the display panel, and is configured to drive the first pixel circuit and the second pixel circuit to operate.

Optionally, the display device further includes a photosensitive sensor, wherein the photosensitive sensor is disposed in a second display region of the display panel.

Optionally, the second display region is rectangular, and an area of an orthographic projection of the photosensitive sensor on a base substrate is less than or equal to an area of an incircle of the second display region.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

FIG. 3 is a schematic structural diagram of still another display panel according to an embodiment of the present disclosure;

DETAILED DESCRIPTION

For clearer description of the objectives, technical solutions, and advantages in the present disclosure, the embodiments of the present disclosure are described in further detail hereinafter with reference to the accompanying drawings.

With the development of display technologies, an existing notch display design or water drop display design gradually cannot meet users' requirements of high screen-to-body ratios of display panels, and a series of display panels provided with a light-transmitting display region have emerged. In this type of display panels, hardware such as a photosensitive sensor (for example, a camera) may be disposed in the light-transmitting display region, and therefore it is not necessary to punch a hole. Therefore, while the practicability of display panels is ensured, real full-screen displays become possible.

Embodiments of the present disclosure provide a display panel. Under the premise of ensuring reliable driving of the light-emitting elements in a light-transmitting display region and ensuring good light transmittance in the light-transmitting display region, the display panel does not reduce the number of pixels in a non-light-transmitting display region, thereby ensuring that the display effect of the non-light-transmitting display region is good.

Figure 1:
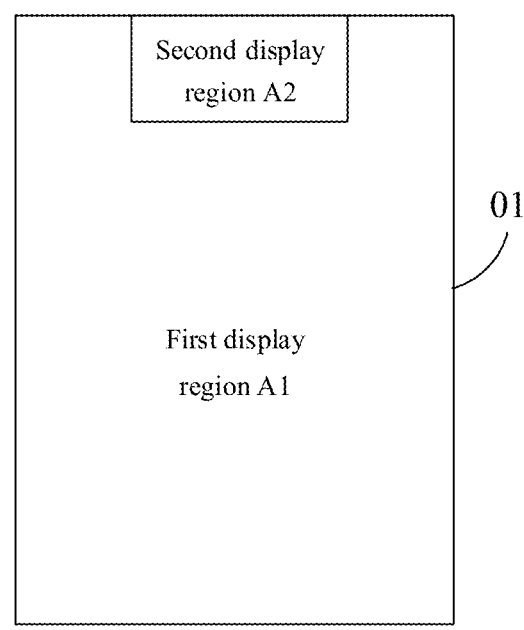
FIG. 1 is a schematic structural diagram of a display panel according to an embodiment of the present disclosure.

FIG. 1 is a schematic structural diagram of a display panel according to an embodiment of the present disclosure. As shown in FIG. 1, the display panel may include a base substrate 01.

The base substrate 01 may include a first display region A1 and a second display region A2. The first display region A1 may at least be partially disposed around the second display region A2. For example, the second display region A2 shown in FIG. 1 is located at a top center position of the base substrate 01. Correspondingly, four sides of the rectangular first display region A1 may all surround the second display region A2. That is, the second display region A2 may be surrounded by the first display region A1.

In some embodiments, the second display region A2 may be alternatively not located at the top center position of the base substrate 01 shown in FIG. 1, but located at another position. For example, with reference to FIG. 1, the second display region A2 may be located at an upper left corner position or an upper right corner position of the base substrate 01.

Figure 2:
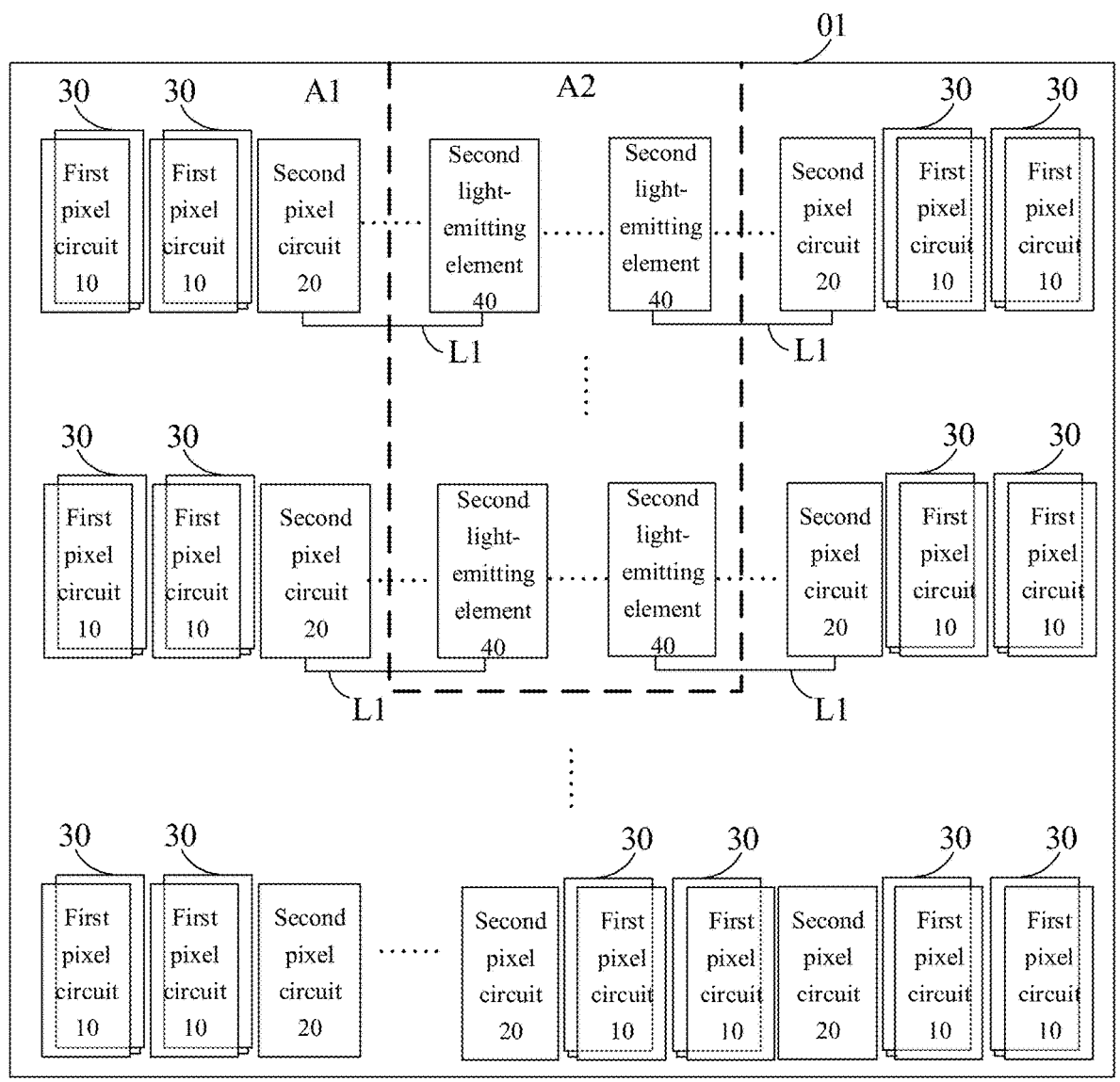
FIG. 2 is a schematic structural diagram of another display panel according to an embodiment of the present disclosure.

In combination with another display panel shown in FIG. 2, it can be seen that the display panel may further include: a plurality of first pixel circuits 10, a plurality of second pixel circuits 20, and a plurality of first light-emitting elements 30 are disposed in the first display region A1, and a plurality of second light-emitting elements 40 that are disposed in the second display region A2. The plurality of second pixel circuits 20 may be disposed at intervals among the plurality of first pixel circuits 10.

At least one first pixel circuit 10 of the plurality of first pixel circuits 10 may be connected to at least one first light-emitting element 30 of the plurality of first light-emitting elements 30, and an orthographic projection of the at least one first pixel circuit 10 on the base substrate 01 is at least partially overlapped with an orthographic projection of the at least one first light-emitting element 30 on the base substrate 01. The at least one first pixel circuit 10 may be used for providing a drive signal for the connected first light-emitting element 30 to drive the first light-emitting element 30 to emit light.

At least one second pixel circuit 20 of the plurality of second pixel circuits 20 may be connected to at least one second light-emitting element 40 of the plurality of second light-emitting elements 40 by a conductive trace L1. The at least one second pixel circuit 20 may be used for providing a drive signal for the connected second light-emitting element 40 to drive the second light-emitting element 40 to emit light. The second light-emitting element 40 and the second pixel circuit 20 are located in different regions. Therefore, as shown in FIG. 2, there is no overlapping portion between an orthographic projection of the at least one second pixel circuit 20 on the base substrate 01 and an orthographic projection of the at least one second light-emitting element 40 on the base substrate 01.

Optionally, in the embodiments of the present disclosure, the first display region A1 may be disposed as a non-light-transmitting display region, and the second display region A2 may be disposed as a light-transmitting display region. That is, the first display region A1 described in the embodiments of the present disclosure may be not light-transmitting, and the second display region A2 may be light-transmitting. In this way, there is no need to punch a hole in the display panel, and a required hardware structure such as a photosensitive sensor may be directly disposed in the second display region A2, to provide a solid basis for implementing a real full-screen display. In addition, since only the light-emitting elements are included in the second display region A2, and the pixel circuits are not included, the light transmittance of the second display region A2 can be ensured to be good.

In summary, the embodiments of the present disclosure provide a display panel. The display panel includes a base substrate including a first display region and a second display region. Since pixel circuits for driving light-emitting elements in the second display region are only disposed in the first display region but not disposed in the second display region, the light transmittance of the second display region is ensured to be good. Correspondingly, the display panel described in the embodiments of the present disclosure has a good display effect.

FIG. 3 is a schematic structural diagram of another display panel by taking the display panel shown in FIG. 2 as an example. With reference to FIG. 3, it can be further seen that the first display region A1 not only includes a plurality of pixels, but also includes a plurality of columns of second pixel circuits 20, and the second display region A2 includes only a plurality of second light-emitting elements 40.

The pixel is a structure including a pixel circuit and light-emitting elements. Taking the first pixel circuit 10 and the first light-emitting element 30 as an example, it can be seen from FIG. 3 that each pixel includes one red sub-pixel R, two green sub pixels G1 and G2, and one blue sub-pixel B. The red sub-pixel R and the blue sub-pixel B are located in the same column. The two green sub pixels G1 and G2 are located in the same column. In some embodiments, the pixel may also include sub-pixels of another color and another quantity. An arrangement mode of the sub-pixels is not limited to the structure shown in FIG. 3. For example, each pixel may include only one red sub-pixel R, one blue sub-pixel B, and one green sub-pixel G.

Optionally, in the embodiments of the present disclosure, the electrical connection relationship between the plurality of first pixel circuits 10 and the plurality of first light-emitting elements 30 may correspond to one another. That is, each first pixel circuit 10 may be connected to one first light-emitting element 30, and the first pixel circuits 10 are connected to different first light-emitting elements 30. Therefore, combined with the display panel shown in FIG. 2, an orthographic projection of each first pixel circuit 10 on the base substrate 01 is at least partially overlapped with an orthographic projection of the connected first light-emitting element 30 on the base substrate 01.

The electrical connection relationship between the plurality of second pixel circuits 20 and the plurality of second light-emitting elements 40 may correspond to one another, similar to the electrical connection relationship between the first pixel circuits 10 and the first light-emitting elements 30. In addition, an orthographic projection of each second pixel circuit 20 on the base substrate 01 is not overlapped with an orthographic projection of the connected second light-emitting element 40 on the base substrate 01.

Optionally, a density of the plurality of second light-emitting elements 40 located in the second display region A2 may be the same as a density of the plurality of first light-emitting elements 30 located in the first display region A1. That is, the same quantity of light-emitting elements are included per inch in the first display region A1 and the second display region A2. That is, the first display region A1 (that is, the main display region) does not include two subregions with different pixel density, such that compared with the related art, when displaying a picture, the first display region A1 does not have a bright-dark border line, and the display effect of the display panel is good.

Figure 4:
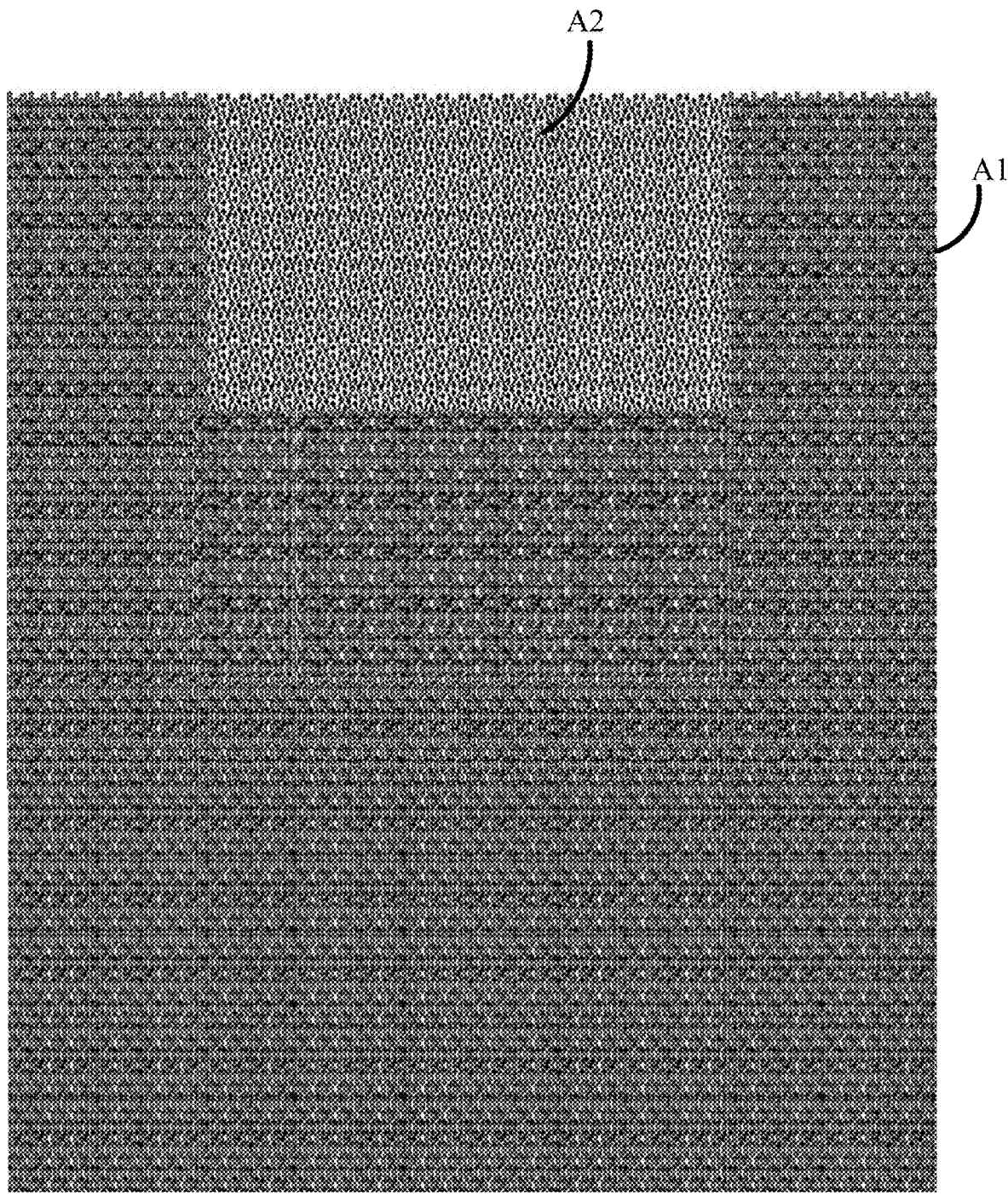
FIG. 4 is a schematic structural diagram of yet another display panel according to an embodiment of the present disclosure.

Taking the display panel shown in FIG. 2 as an example, FIG. 4 shows a structural layout of the display panel. With reference to FIG. 4, it can be seen that a resolution of the first display region A1 may be greater than a resolution of the second display region A2. That is, the area of the first display region A1 is larger than the area of the second display region A2, and the quantity of the light-emitting elements included in the first display region A1 is greater than the quantity of the light-emitting elements included in the second display region A2.

In some embodiments, the resolution of the first display region A1 may be less than or equal to the resolution of the second display region A2. For example, the area of the first display region A1 may be the same as the area of the second display region A2, and the quantity of the light-emitting elements included in the first display region A1 may also be the same as the quantity of the light-emitting elements included in the second display region A2. Alternatively, the area of the first display region A1 may be less than the area of the second display region A2, and the quantity of the light-emitting elements included in the first display region A1 may be less than the quantity of the light-emitting elements included in the second display region A2.

Figure 5:
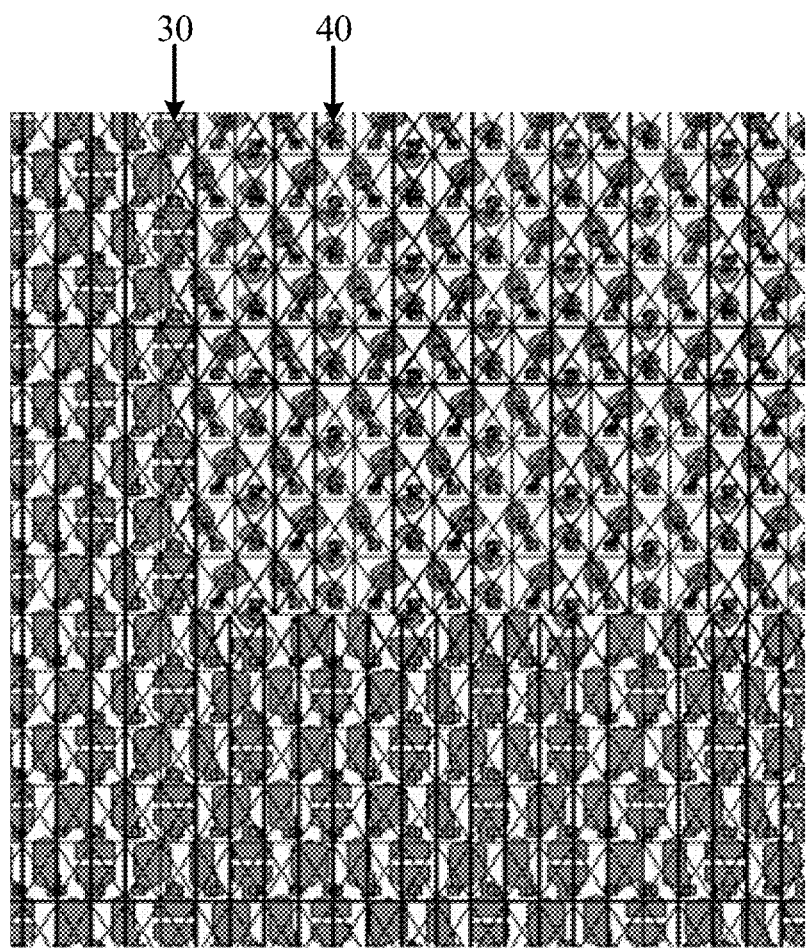
FIG. 5 is a schematic structural diagram of yet another display panel according to an embodiment of the present disclosure.

Optionally, FIG. 5 is a partial schematic enlarged view of the display panel shown in FIG. 4. Combined with FIG. 4 and FIG. 5, it can be seen that the size of the first light-emitting element 30 may be greater than the size of the second light-emitting element 40. That is, an anode of the light-emitting element in the second display region A2 is smaller than an anode of the light-emitting element in the first display region A1. In this way, the light transmittance of the second display region A2 being greater than the light transmittance of the first display region A1 can be ensured. Moreover, the shape and size of an anode of the second light-emitting element 40 may be further optimized to ensure better light transmittance. For example, combined with the display panel shown in FIG. 3, the anode of the shown second light-emitting element 40 is elliptical.

Optionally, to further ensure that the light transmittance of the second display region A2 is good, the conductive trace L1 described in the embodiments of the present disclosure may be a transparent conductive trace. For example, the conductive trace L1 may be made of a transparent material such as indium tin oxide (ITO) or indium gallium zinc oxide (IGZO). Assuming that the conductive trace L1 is made of ITO, the conductive trace L1 may also be referred to as an ITO trace. All the following embodiments take that the conductive trace L1 is the ITO trace as an example for description.

Figure 6:
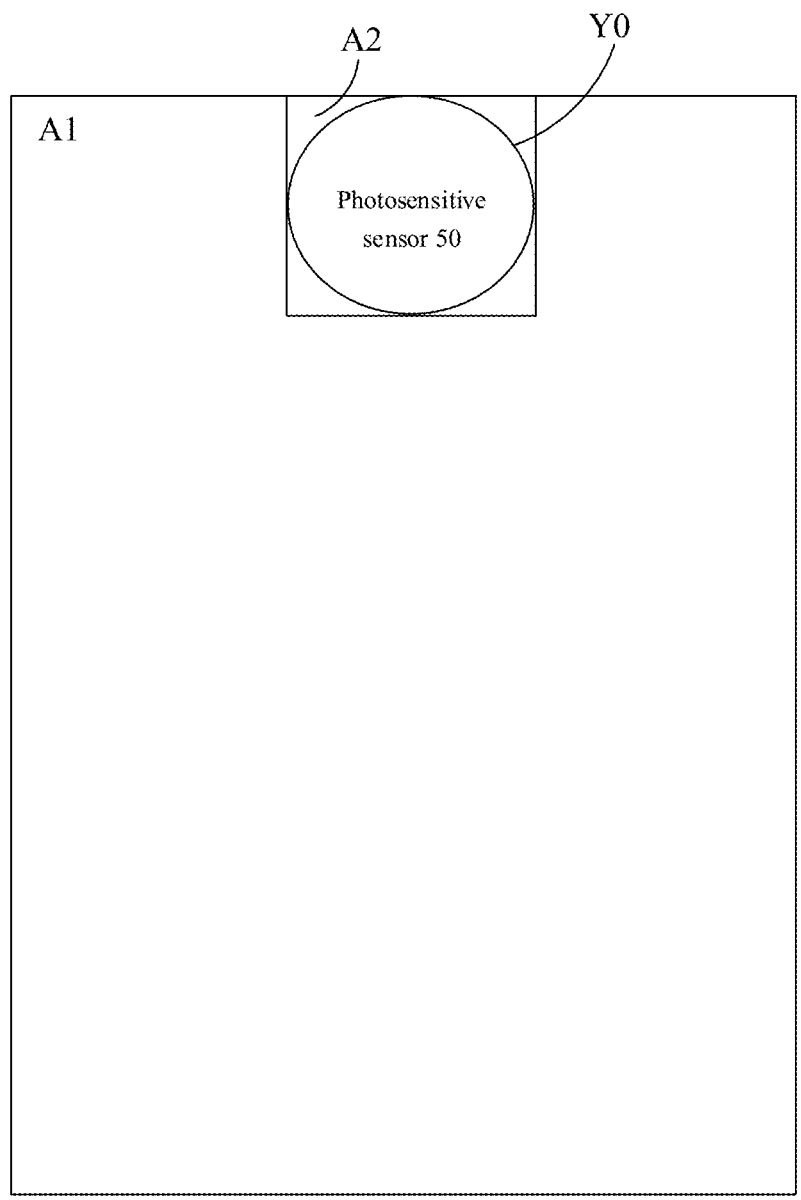
FIG. 6 is a schematic structural diagram of yet another display panel according to an embodiment of the present disclosure.

Optionally, in the embodiments of the present disclosure, the base substrate 01 is provided with a light-transmitting display region, that is, the second display region A2. Therefore, as shown in FIG. 6, the structure of a photosensitive sensor 50 (for example, a camera) in a display module included in a display device may be directly disposed in the second display region A2. That is, there is no need to additionally punch a hole in the display panel. In this way, a solid basis is provided for implementing a full-screen display panel.

Optionally, the second display region A2 may be rectangular, and the area of an orthographic projection of the photosensitive sensor 50 on the base substrate 01 may be less than or equal to the area of an incircle of the second display region A2. That is, the size of a region in which the photosensitive sensor 50 is located may be less than or equal to the size of the incircle of the second display region A2. For example, combined with the display panel shown in FIG. 6, the size of a region in which the photosensitive sensor 50 is located is equal to the size of an incircle Y0 of the second display region A2. That is, the shape of the region in which the photosensitive sensor 50 is located may be circular. Correspondingly, the region in which the photosensitive sensor 50 is located may also be referred to as a light hole. In some embodiments, the second display region A2 may also be in another shape except the rectangular shape, such as a circular shape or an elliptical shape.

In the related art, the size (pitch) of a pixel circuit (including the first pixel circuit 10 and the second pixel circuit 20) is the same as the size of the first light-emitting element 30. For example, a typical width is about 30 μm to 32 μm and a length is about 60 μm to 65 μm. In the embodiments of the present disclosure, to provide sufficient space for the arrangement of the second pixel circuit 20 without reducing the number of pixels in the first display region A1, the pixel circuits may be compressed in a second direction X2 (for example, an extension direction of a gate line, which may also be referred to as a transverse direction), such that a width of the pixel circuit in the second direction is less than the width of the first light-emitting element 30. Alternatively, the width of the first light-emitting element 30 in the second direction is greater than the width of the first light-emitting element 30 by stretching the first light-emitting element 30 in the second direction. In this way, on the premise that the size of the base substrate 01 is kept the same, more regions can be provided in the first display region A1, and correspondingly, second pixel circuits 20 dedicated to driving the second light-emitting elements 40 located in the second display region A2 can be disposed at the more regions.

Figure 7:
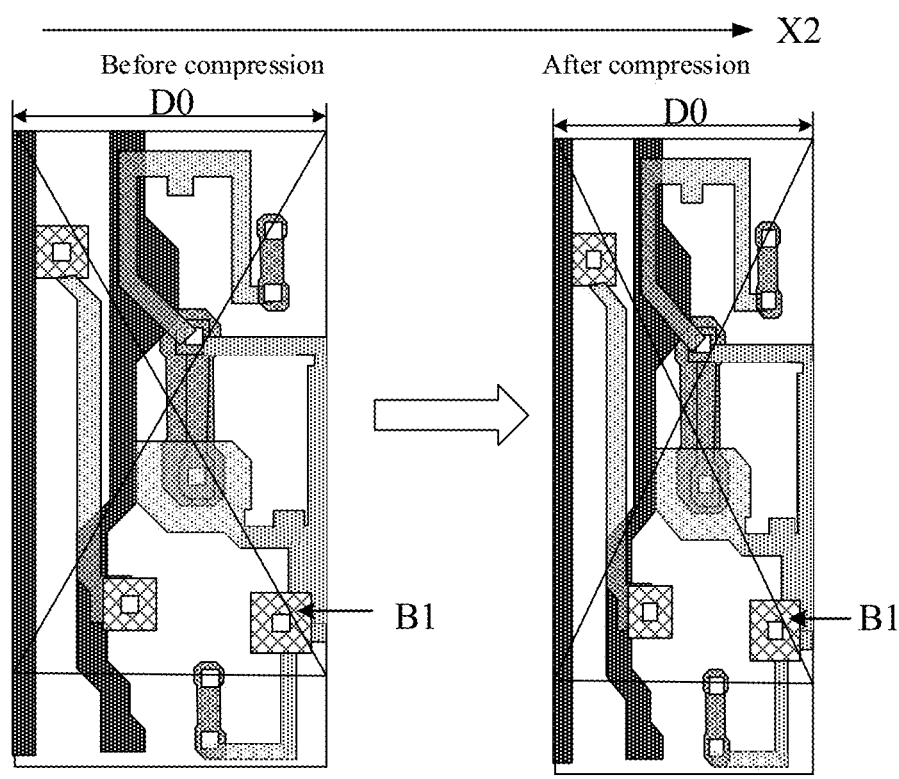
FIG. 7 shows layouts of a pixel circuit before and after compression according to an embodiment of the present disclosure.

For example, a difference between the width of each pixel circuit and the width of the first light-emitting element 30 may be about 4 μm. Taking a compressed pixel circuit and a width difference of 4 μm as an example, FIG. 7 shows structural layouts of a pixel circuit before and after compression (that is, the related art and the embodiments of the present disclosure). With reference to FIG. 7, it can be seen that the pixel circuit may include a driving structure and a connecting member B1 used for connecting to an anode of a light-emitting element. The size of the connecting member B1 may represent the size of a pixel circuit. Before compression, the sizes of the pixel circuit and the light-emitting element both have a width of 1 μm to 100 μm and a height of 2 μm to 200 μm. After compression, the size of the light-emitting element is kept unchanged and the height of the pixel circuit is kept unchanged, but the width of the pixel circuit is reduced by 1 μm to 20 μm. Thus, there are one or more additional columns of compression pixel circuits in every several columns of compression pixel circuits, and the whole screen adopts the design to realize full-screen compression. These additional columns may be chosen for connecting the second light-emitting elements 40 in the second display region A2 to control the second light-emitting elements 40 to emit light. In some embodiments, the additional columns of pixel circuits proximal to the periphery of the second display region A2 preferably serve as the second pixel circuits 20 for connecting the second light-emitting elements 40. In this way, a normal display can be ensured without changing the resolution of the display panel. That is, the existing space of the display panel is fully used to achieve a normal display.

It needs to be noted that, with reference to FIG. 3, the width of the pixel circuit may be a length of an orthographic projection of a layout of the pixel circuit on the base substrate 01 in the second direction X2. The width of the first light-emitting element 30 is a length of an orthographic projection of an anode of the first light-emitting element 30 on the base substrate 01 in the second direction X2.

Figure 8:
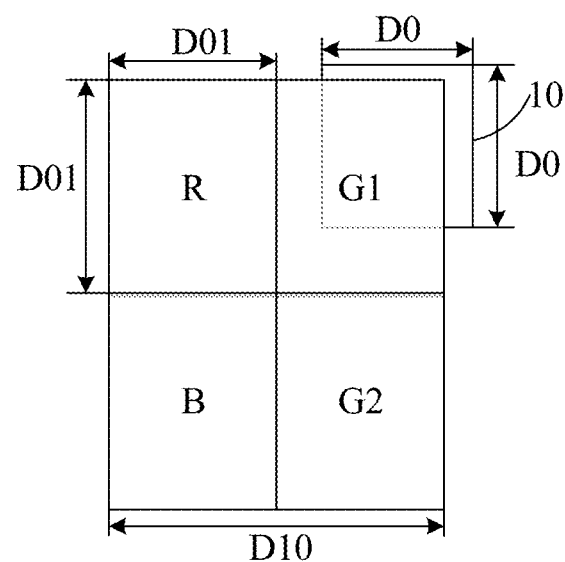
FIG. 8 is a schematic structural diagram of a display panel according to an embodiment of the present disclosure.

In addition, combined with FIG. 3 and FIG. 8, each of the first light-emitting elements described in the embodiments of the present disclosure belongs to one sub-pixel in one pixel, such as a red sub-pixel R, a green sub-pixel G1 or G2, or a blue sub-pixel B. When the size of the anode of the first light-emitting element is determined, a width D10 of the pixel in a first direction X1 or the second direction X2 may be measured generally in a period of one pixel as a period, and the width D01 of each first light-emitting element may be obtained by dividing the total width D10 of the pixel by a quantity of sub-pixels (for example, 4 shown in FIG. 8) included in the pixel. Similarly, since each first light-emitting element is connected to one pixel circuit, the width of each pixel circuit in the first direction X1 or the second direction X2 may still be measured with each pixel circuit connected to one pixel as a period, and the width D0 of each pixel circuit may be obtained by dividing the total width by the quantity of sub-pixels included in the pixel.

Figure 9:
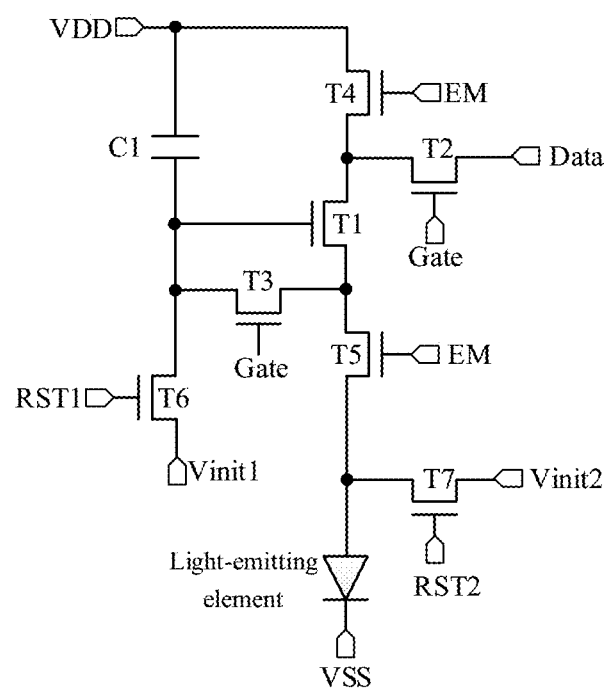
FIG. 9 is a schematic structural diagram of a pixel circuit according to an embodiment of the present disclosure.

Optionally, with reference to the pixel circuit shown in FIG. 7, the pixel circuit described in the embodiments of the present disclosure may be a 7T1C structure, that is, may include 7 transistors and 1 capacitor. FIG. 9 shows a schematic structural diagram of a 7T1C pixel circuit, and FIG. 10 shows a structural layout of the 7T1C pixel circuit.

Figure 10:
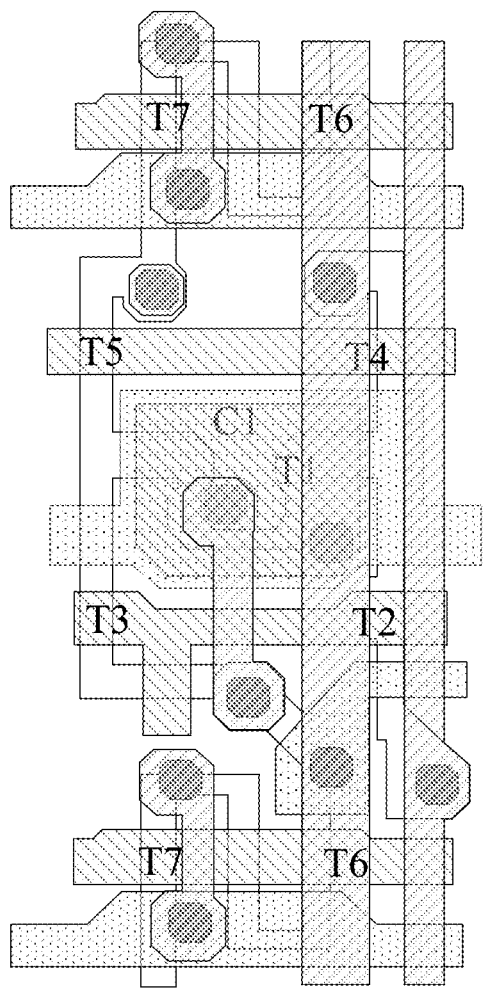
FIG. 10 shows a schematic layout of a pixel circuit according to an embodiment of the present disclosure.

Combined with the pixel circuit shown in FIG. 9 and FIG. 10, it can be known that the 7T1C pixel circuit 10 includes a driving transistor T1, a data write transistor T2, a threshold compensation transistor T3, a first light-emitting control transistor T4, a second light-emitting control transistor T5, a first reset transistor T6, a second reset transistor T7, and a storage capacitor C1. The pixel circuit may be connected to a gate signal terminal Gate, a data signal terminal Data, reset signal terminals RST1 and RST2, a light-emitting control signal terminal EM, a power supply terminal VDD, initial power supply terminals Vinit1 and Vinit2, and light-emitting elements. The light-emitting elements may also be connected to a power supply terminal VSS. The pixel circuit may be used to drive the connected light-emitting elements to emit light in response to signals provided by the connected signal terminals.

In addition, transistors may be classified, according to the characteristics of transistors, into N-type transistors and P-type transistors. The embodiments of the present disclosure are described by taking the transistor being the P-type transistor as an example. Based on the description and teachings of the implementations of the present disclosure, a person skilled in the art can easily conceive that N-type transistors are used for at least part of the transistors in the pixel circuit structure in the embodiments of the present disclosure without creative efforts, that is, an implementation of N-type transistors or implementation of combining N-type transistor and P-type transistors is used. Therefore, these implementations also fall within the protection scope of the embodiments of the present disclosure.

Figure 11:
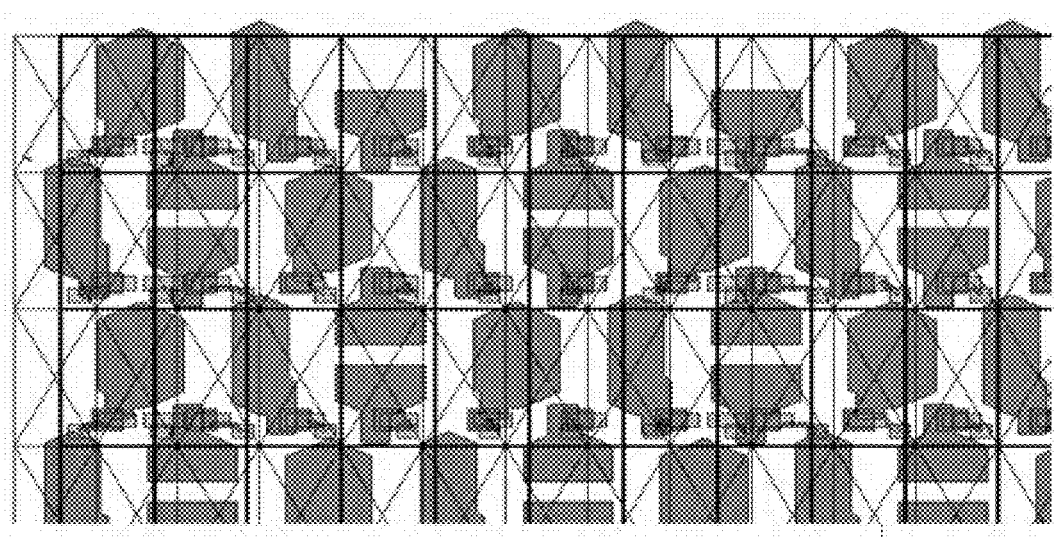
FIG. 11 is a schematic structural diagram of yet another display panel according to an embodiment of the present disclosure.
Figure 12:
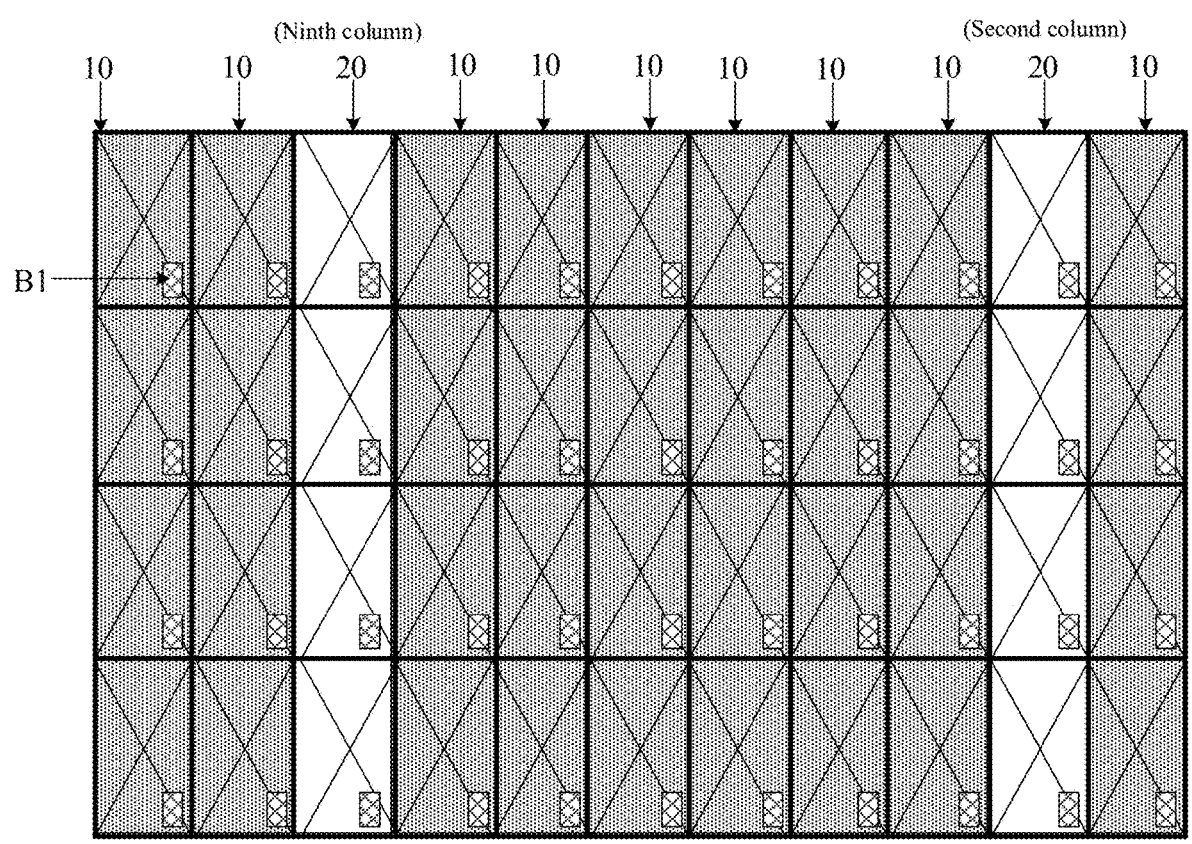
FIG. 12 is a schematic structural diagram of yet another display panel according to an embodiment of the present disclosure.
Figure 13:
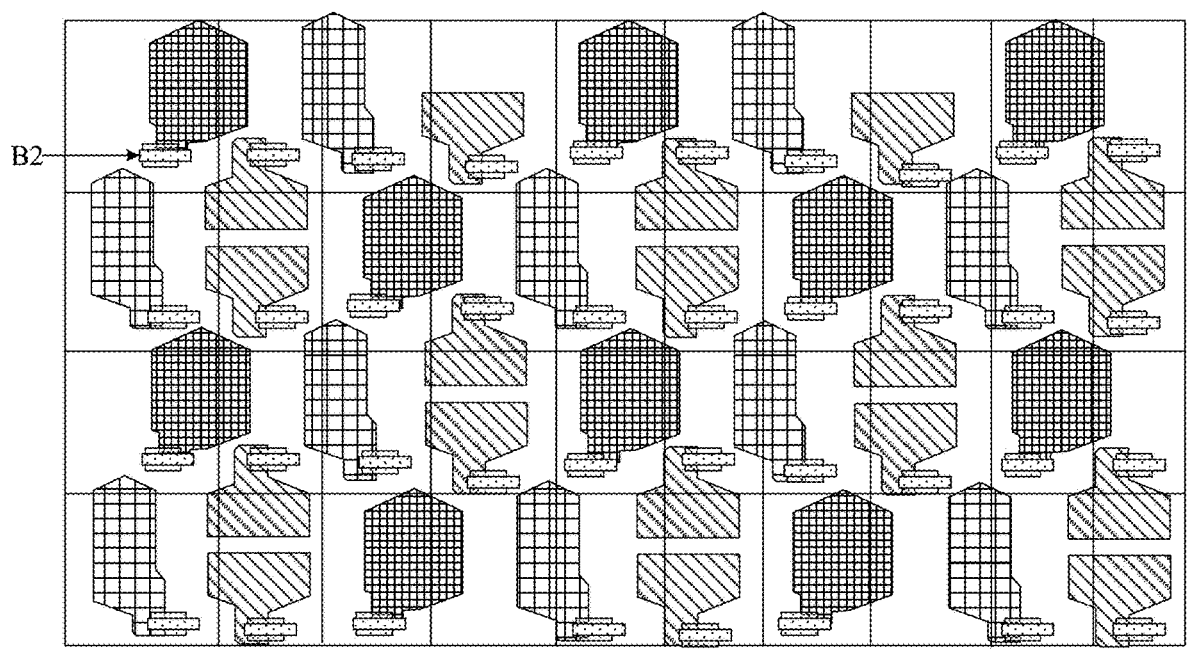
FIG. 13 is a schematic structural diagram of yet another display panel according to an embodiment of the present disclosure.

To further reflect that there are a plurality of additional columns of pixel circuits after the pixel circuits are compressed, FIG. 11 is a schematic structural diagram of the first display region A1. FIG. 12 is a schematic diagram of a partial structure (including only a pixel circuit) in FIG. 4. FIG. 13 is a schematic diagram of a partial structure (including only the light-emitting elements) in FIG. 4.

With reference to FIG. 11 to FIG. 13, it can be seen that the width of the pixel circuit is less than the width of the light-emitting element. In this way, the pixel circuits in the second column and the ninth column from left to right are not connected to any first light-emitting element 30, which belong to the additional column of pixel circuits and may serve as the second pixel circuit 20 for connecting the second light-emitting elements 40 in the second display region A2. In addition, each first light-emitting element 30 may include a total of four anodes RG1BG2 and a connecting member B2 used for connecting the first pixel circuit 10. The connecting member B1 of the first pixel circuit 10 and the connecting member B2 of the first light-emitting element 30 may be connected by a source-drain metal layer SD2. Alternatively, in the case that the first pixel circuit 10 and the first light-emitting element 30 are lapped together, there is no need to dispose the SD2 for connection.

It should be noted that each of at least one second pixel circuit 20 and at least one second light-emitting element 40 may be provided with a connecting member. When the at least one second pixel circuit 20 is connected to the at least one second light-emitting element 40 by the conductive trace L1, it may be in practice that the conductive trace L1 is respectively connected to the connecting member of the at least one second pixel circuit 20 and the connecting member of the at least one second light-emitting element 40.

Therefore, to ensure that there is sufficient space for the conductive trace L1, an axis of the connecting member of each second pixel circuit 20 located in the same row may be flush with an axis of the connecting member of any second light-emitting element 40. The axes may extend in the second direction X2. That is, in the same row in a row direction, the connecting member of the second pixel circuit 20 and the connecting member of the second light-emitting element 40 are located in the same straight line. Similarly, combined with FIG. 11 to FIG. 13, in the same row, the connecting member B1 of the first pixel circuit 10 and the connecting member B2 of the first light-emitting element 30 may also be located in the same straight line, such that the traces are arranged neatly.

Figure 14:
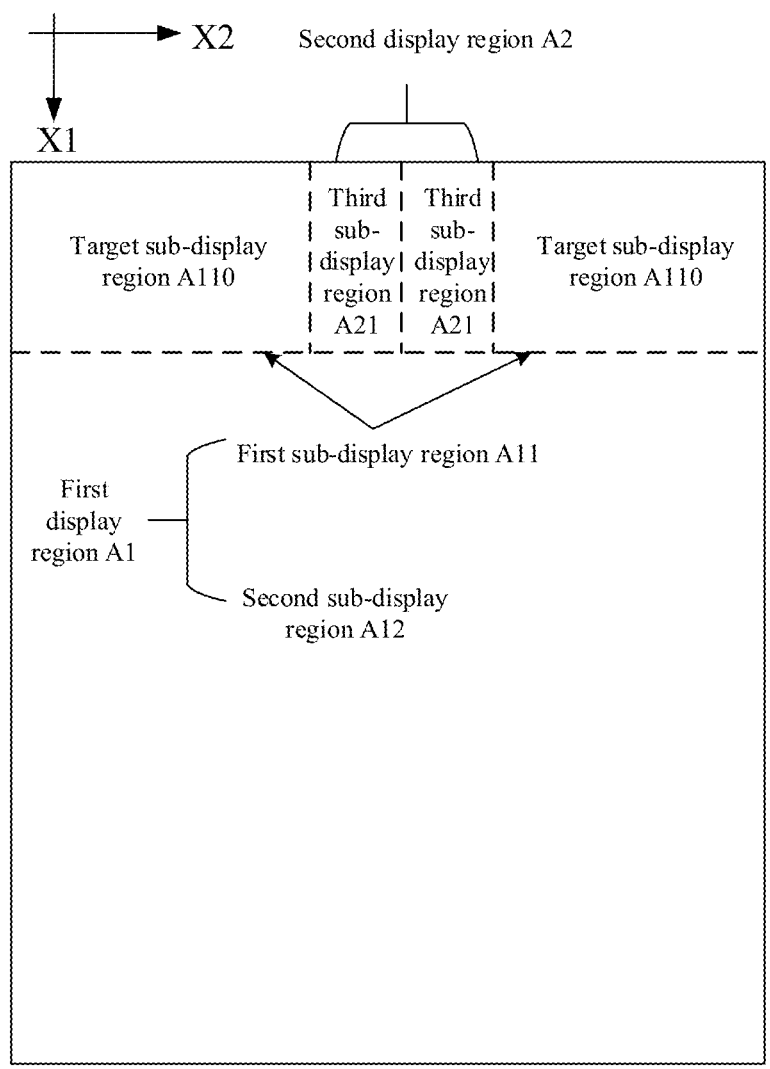
FIG. 14 is a schematic structural diagram of yet another display panel according to an embodiment of the present disclosure.

Optionally, FIG. 14 is a schematic structural diagram of yet another display panel according to an embodiment of the present disclosure. As shown in FIG. 14, the first display region A1 may include a first sub-display region A11 and a second sub-display region A12 sequentially arranged in the first direction X1. The first sub-display region A11 may include two symmetrical target sub-display regions A110. That is, the two target sub-display regions A110 have the same layout. The second display region A2 may include two third sub-display regions A21 symmetrically arranged in the second direction X2. That is, the two third sub-display regions A21 have the same layout. One target sub-display region A110, the second display region A2, and the other target sub-display region A110 may be sequentially arranged in the second direction X2.

Based on the display panel shown in FIG. 14, the left half part and the right half part of the display panel have the same layout. Therefore, the following embodiments show only the left half structure of the display panel, that is, one target sub-display region A110 located at the left half part and one adjacent third sub-display region A21. The right half part is similar, and details are not described again.

Moreover, the additional columns of pixel circuits, that is, the plurality of second pixel circuits 20, described in the embodiments of the present disclosure may be dispersedly disposed in the first display region A1, and the disposition positions may be flexibly adjusted according to the requirement, as long as the second light-emitting element 40 can be effectively connected to the second light-emitting element 40 and drive the second light-emitting element 40 to reliably emit light. For example, in the embodiments of the present disclosure, the disposition positions of the second pixel circuits 20 are schematically described below by taking an example in which the plurality of second pixel circuits 20 are distributed in a column direction, a row direction, and a diagonal direction.

Figure 15:
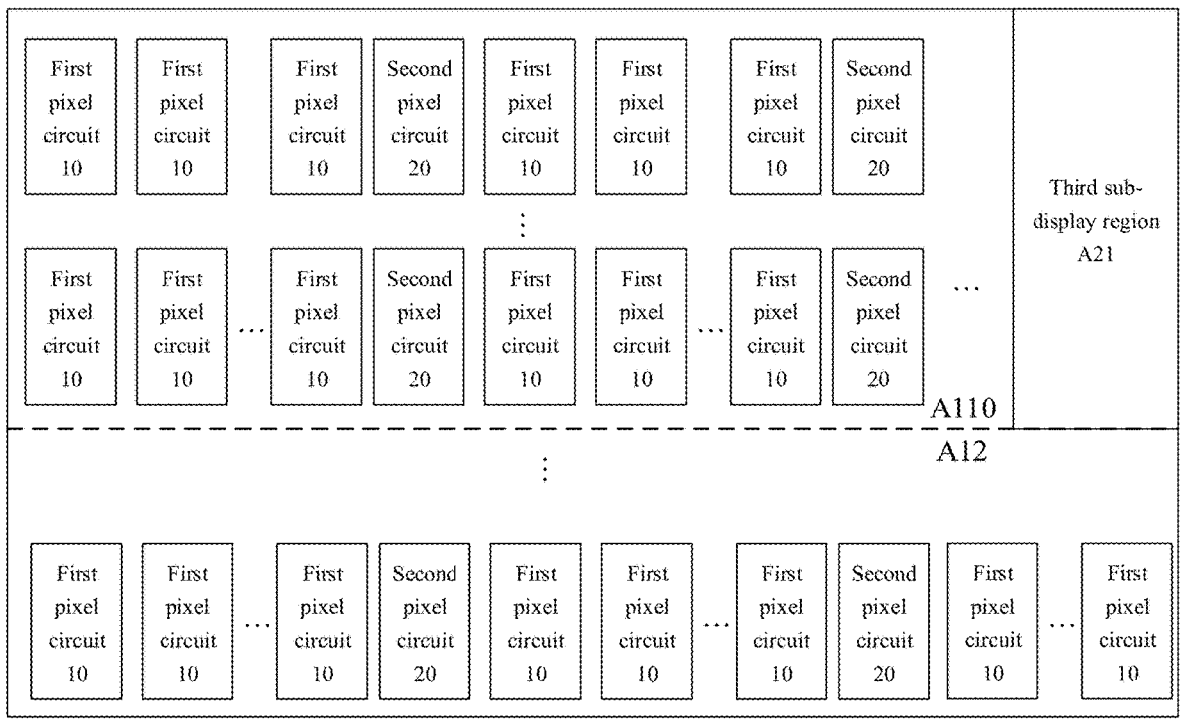
FIG. 15 is a schematic structural diagram of yet another display panel according to an embodiment of the present disclosure.

In an optional implementation, the second pixel circuit 20 extends in the column direction. FIG. 15 is a schematic structural diagram of yet another display panel according to an embodiment of the present disclosure. Combined with FIG. 14 and FIG. 15, it can be seen that the plurality of first pixel circuits 10 may include a plurality of columns of first pixel circuits 10 extending in the first direction X1, and the plurality of second pixel circuits 20 may include a plurality of columns of second pixel circuits 20 extending in the first direction X1.

The plurality of columns of second pixel circuits 20 may be disposed at intervals among the plurality of columns of first pixel circuits 10. For example, at an interval of a plurality of columns of adjacent first pixel circuits 10, there is one column of second pixel circuits 20. In other words, a plurality of columns of adjacent first pixel circuits 10 may be spaced between every two adjacent columns of second pixel circuits 20.

Optionally, the same quantity of columns of first pixel circuits 10 may be disposed between any two adjacent columns of second pixel circuits 20, such that the arrangement uniformity is ensured. For example, 8 adjacent columns of first pixel circuits 10 are disposed between any two adjacent columns of second pixel circuits 20. Alternatively, the different quantities of columns of first pixel circuits 10 may be disposed between any two adjacent columns of second pixel circuits 20.

Figure 16:
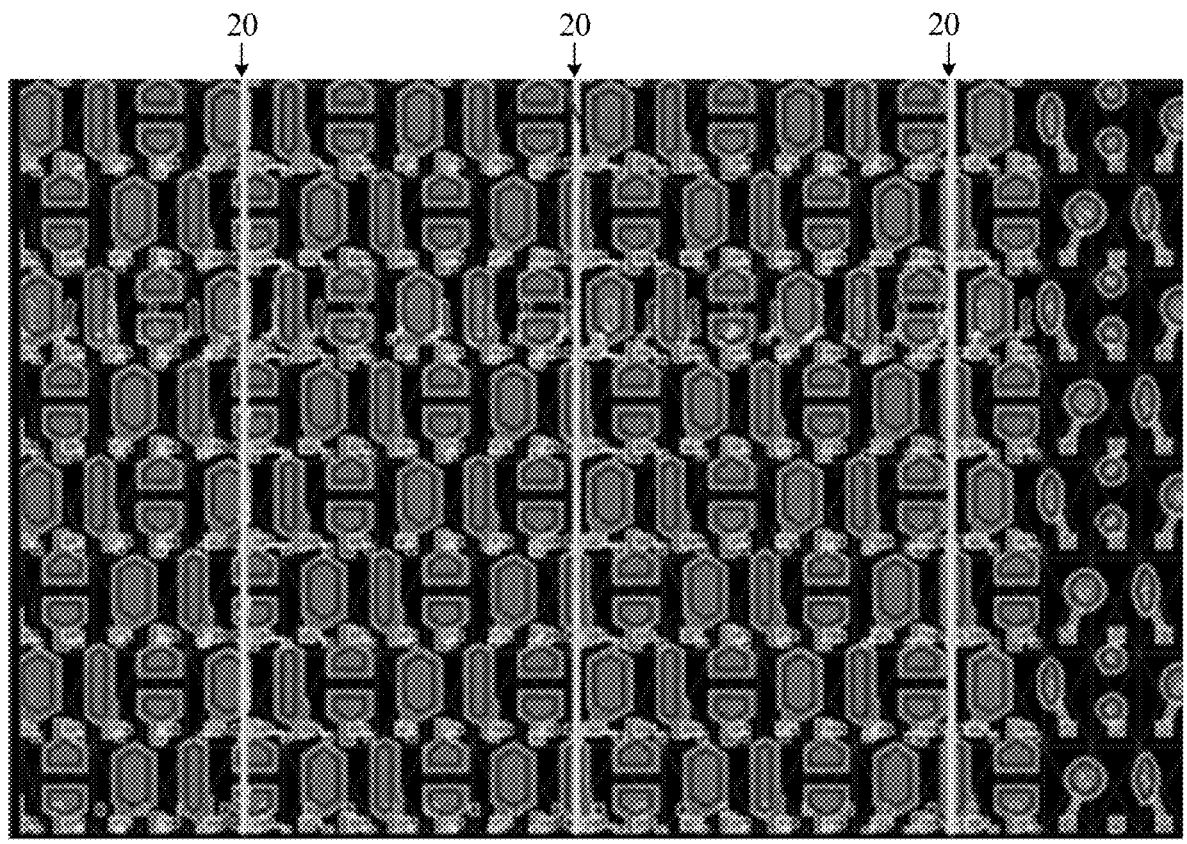
FIG. 16 is a schematic structural diagram of yet another display panel according to an embodiment of the present disclosure.

Exemplarily, combined with the display panel shown in FIG. 16, starting from a left border line between the third sub-display region A21 and the target sub-display region A110, the second column of pixel circuits, the $12^{th}$ column of pixel circuits, and the $20^{th}$ column of pixel circuits on the left may all be the second pixel circuits 20. It needs to be noted that, the additional columns of second pixel circuits 20 below the second display region A2 may serve as dummy columns and are not connected to any light-emitting element.

Figure 17:
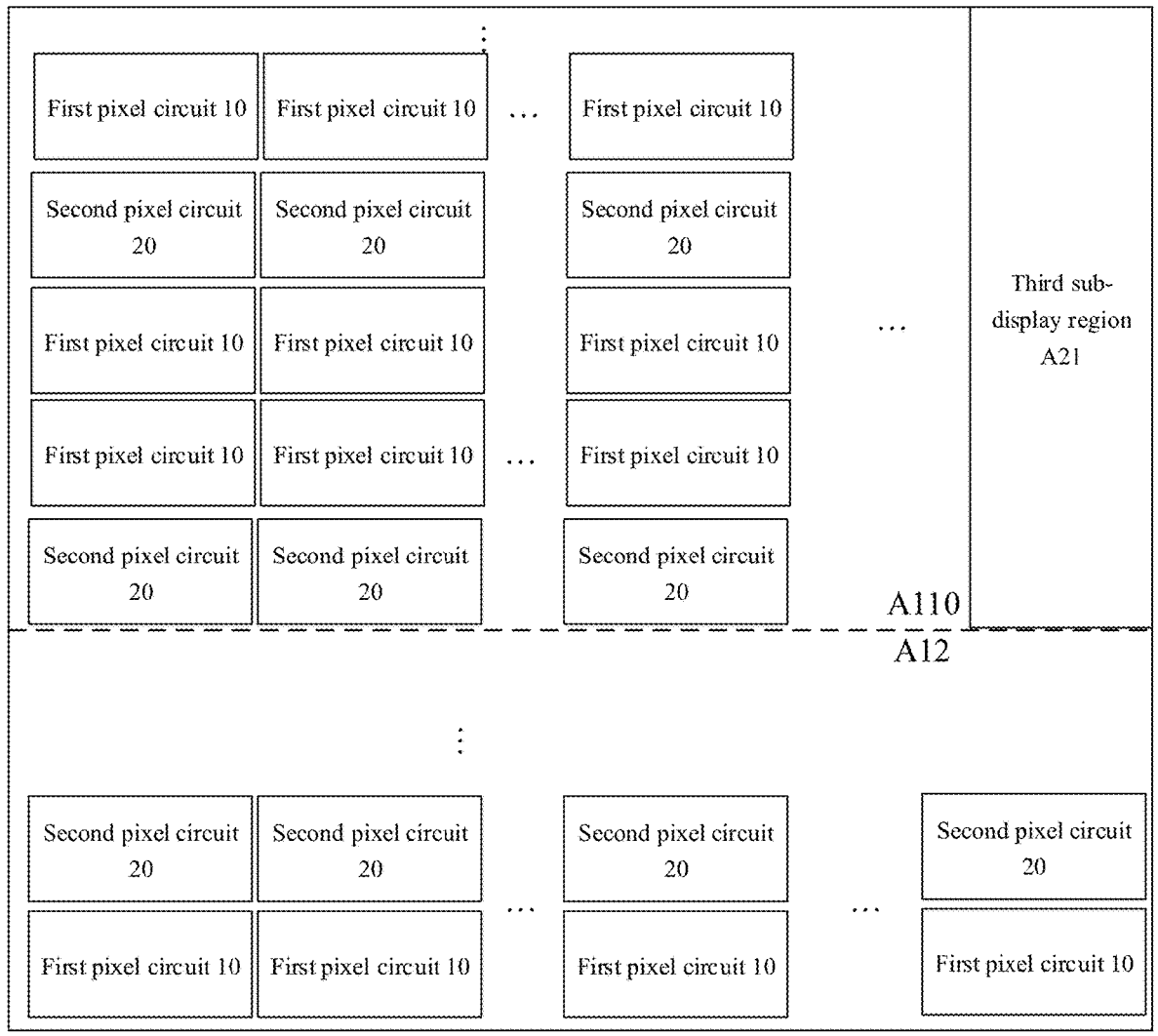
FIG. 17 is a schematic structural diagram of yet another display panel according to an embodiment of the present disclosure.

In another optional implementation, the second pixel circuits 20 do not extend in the column direction, and FIG. 17 is a schematic structural diagram of yet another display panel according to an embodiment of the present disclosure. As shown in FIG. 17, the plurality of first pixel circuits 10 may include a plurality of rows of first pixel circuits 10 extending in the second direction X2, and the plurality of second pixel circuits 20 may include a plurality of rows of second pixel circuits 20 extending in the second direction X2.

Optionally, the first direction X1 may be intersected with the second direction X2. For example, when the first direction X1 is not perpendicular to the second direction X2, the plurality of second pixel circuits 20 may be arranged in the diagonal direction. When the first direction X1 is perpendicular to the second direction X2, the plurality of second pixel circuits 20 may be arranged in the row direction.

The plurality of rows of second pixel circuits 20 are disposed at intervals among the plurality of rows of first pixel circuits 10. For example, the plurality of second pixel circuits 20 shown in FIG. 17 extend in the row direction. That is, at an interval of a plurality of rows of adjacent first pixel circuits 10, there is one row of second pixel circuits 20. In other words, a plurality of rows of adjacent first pixel circuits 10 are disposed between every two adjacent rows of second pixel circuits 20. The following embodiments are described by taking an example in which the plurality of second pixel circuits 20 are sequentially arranged in the column direction.

Figure 18:
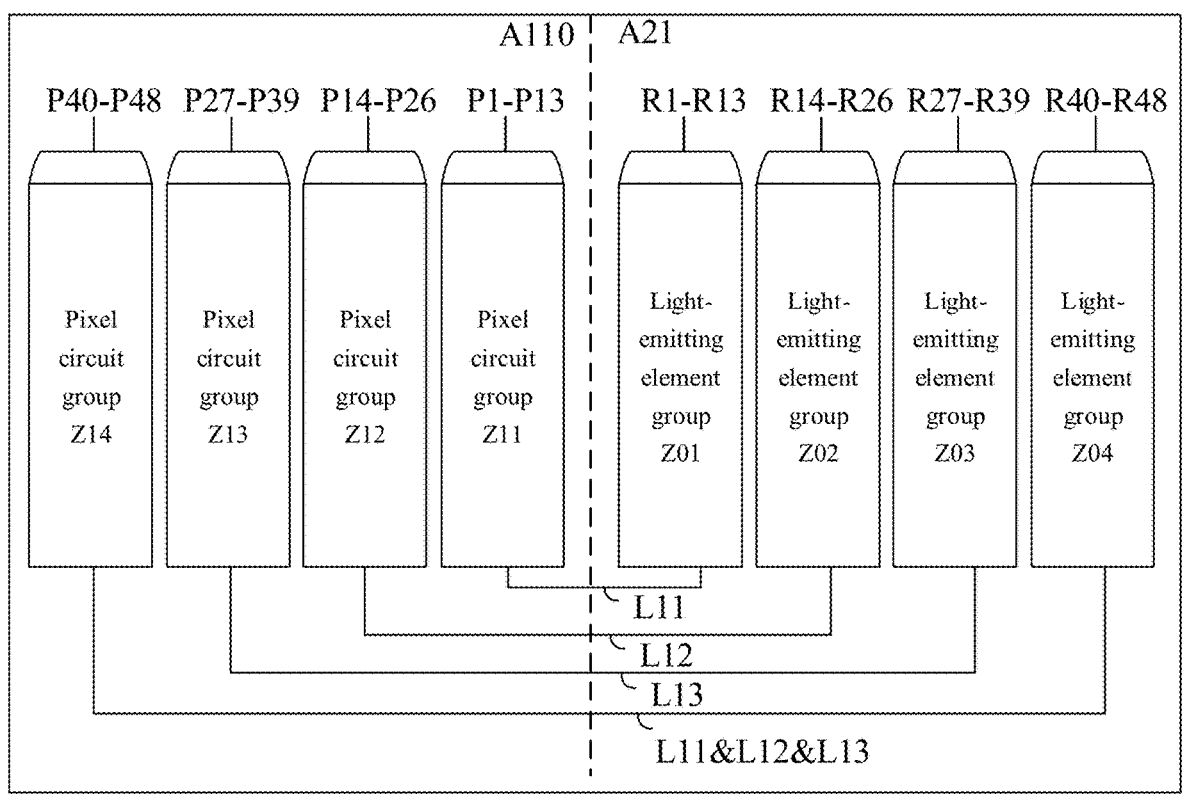
FIG. 18 is a schematic structural diagram of yet another display panel according to an embodiment of the present disclosure.

It needs to be noted that the additional columns of pixel circuits, that is, the second pixel circuit 20, may be connected to the second light-emitting element 40 by the conductive trace L1, and the stack layers of the conductive trace L1 may be flexibly adjusted according to the radius of the light hole. For example, FIG. 18 is a schematic structural diagram of yet another display panel according to an embodiment of the present disclosure. As shown in FIG. 18, the display panel may include a first conductive trace L11 (that is, ITO1), a second conductive trace L12 (that is, ITO2), and a third conductive trace L13 (that is, ITO3).

Each third sub-display region A21 may include k light-emitting element groups. Each light-emitting element group may include a plurality of columns of adjacent second light-emitting elements 40, and a first light-emitting element group to a $k^{th}$ light-emitting element group may be sequentially arranged in a direction going towards the other third sub-display region. Correspondingly, each target sub-display region A110 includes k pixel circuit groups in one-to-one correspondence with the k light-emitting element groups ZO. Each of the k pixel circuit groups may include a plurality of columns of adjacent second pixel circuits 20, and a first pixel circuit group to a $k^{th}$ pixel circuit group may be sequentially arranged in a direction going away from the adjacent third sub-display region.

k may be an integer greater than 0. For example, the embodiments of the present disclosure are described by taking k being 4 as an example. Optionally, each of the first light-emitting element group Z01 to the third light-emitting element group Z03 may include 12 columns of second light-emitting elements 40. The fourth light-emitting element group Z04 may include 8 columns of second light-emitting elements 40. Correspondingly, each of the first pixel circuit group Z11 to the third pixel circuit group Z13 may include 12 columns of second pixel circuits 20. The fourth pixel circuit group Z14 may include 8 columns of second pixel circuits 20.

That is, for the display panel shown in FIG. 18, in the third sub-display region A21, the first column of second light-emitting elements 40 to the $13^{th}$ column of second light-emitting elements 40 (that is, R1 to R13) belong to the first light-emitting element group Z01. The $14^{th}$ column of second light-emitting elements 40 to the $26^{th}$ column of second light-emitting elements 40 (that is, R14 to R26) belong to the second light-emitting element group Z02. The $27^{th}$ column of second light-emitting elements 40 to the $39^{th}$ column of second light-emitting elements 40 (that is, R27 to R39) belong to the third light-emitting element group Z03. The $40^{th}$ column of second light-emitting elements 40 to the $48^{th}$ column of second light-emitting elements 40 (that is, R40 to R48) belong to the fourth light-emitting element group Z04.

Correspondingly, in the target sub-display regions A110, the first column of second pixel circuits 20 to the $13^{th}$ column of second pixel circuits 20 (that is, P1 to P13) belong to the first pixel circuit group Z11. The $14^{th}$ column of second pixel circuits 20 to the $26^{th}$ column of second pixel circuits 20 (that is, P14 to P26) belong to the second pixel circuit group Z12. The $27^{th}$ column of second pixel circuits 20 to the $39^{th}$ column of second pixel circuits 20 (that is, P27 to P39) belong to the third pixel circuit group Z13. The $40^{th}$ column of second pixel circuits 20 to the $48^{th}$ column of second pixel circuits 20 (that is, P40 to P48) belong to the fourth pixel circuit group Z14. FIG. 18 does not show the first pixel circuits 10 and the first light-emitting elements 30.

Optionally, in the embodiments of the present disclosure, the second light-emitting elements 40 in each light-emitting element group may be connected to the second pixel circuits 20 in the corresponding pixel circuit group by the first conductive traces L11, the second conductive traces L12, and/or the third conductive traces L13 in one-to-one correspondence.

Figure 19:
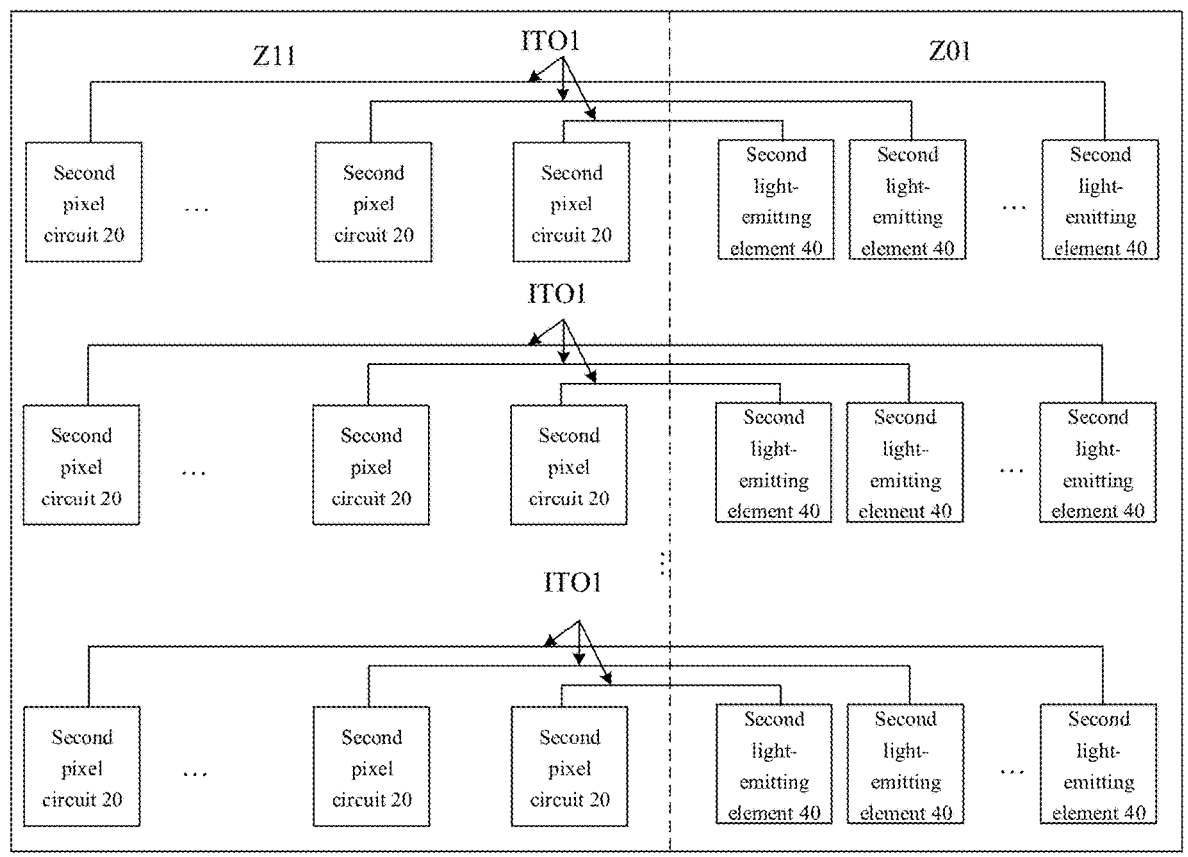
FIG. 19 is a schematic structural diagram of yet another display panel according to an embodiment of the present disclosure.

For example, as shown in FIG. 19, the second light-emitting elements 40 in the first light-emitting element group Z01 may be connected to the second pixel circuits 20 in the first pixel circuit group Z11 by the first conductive traces L11 in one-to-one correspondence (in FIG. 19, ITO1 represents the first conductive trace L11).

Figure 20:
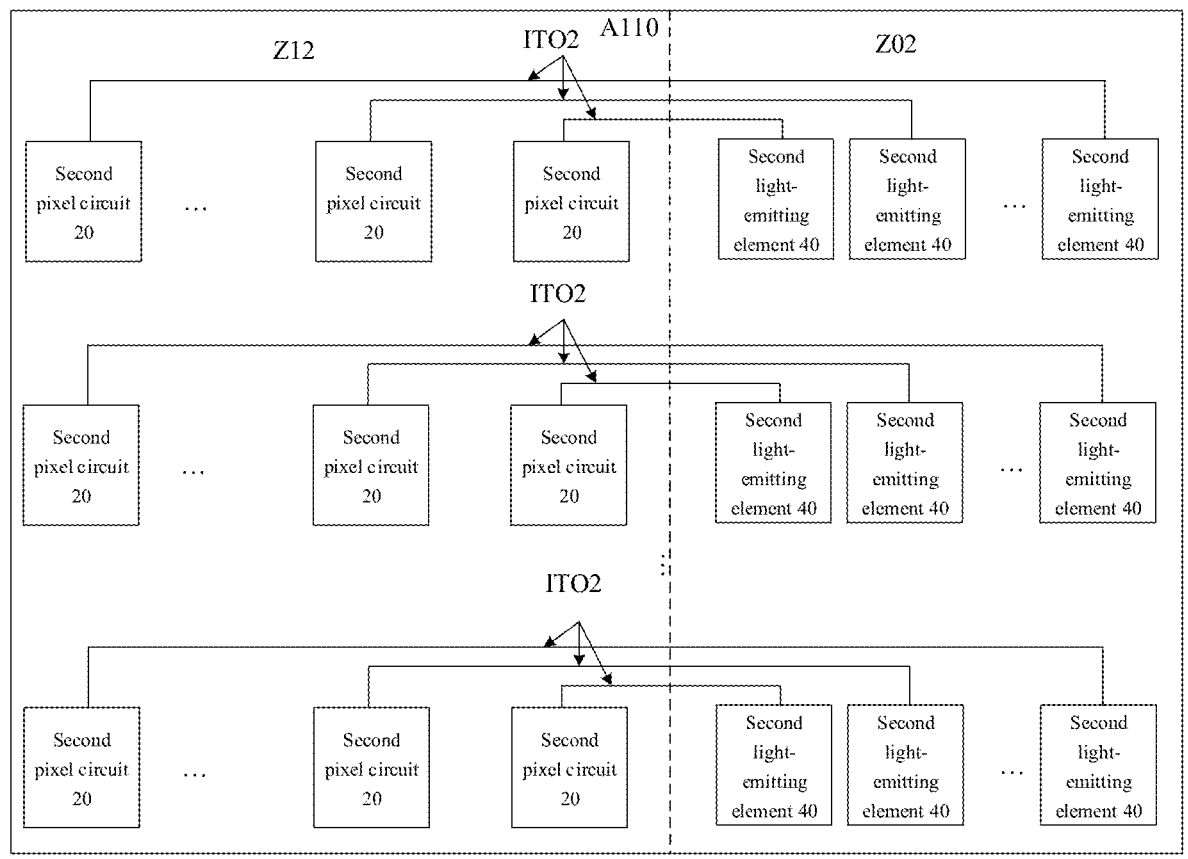
FIG. 20 is a schematic structural diagram of yet another display panel according to an embodiment of the present disclosure.

As shown in FIG. 20, the second light-emitting elements 40 in the second light-emitting element group Z02 may be connected to the second pixel circuits 202 in the second pixel circuit group Z12 by the second conductive trace L12 in one-to-one correspondence (in FIG. 20, ITO2 represents the second conductive trace L12).

Figure 21:
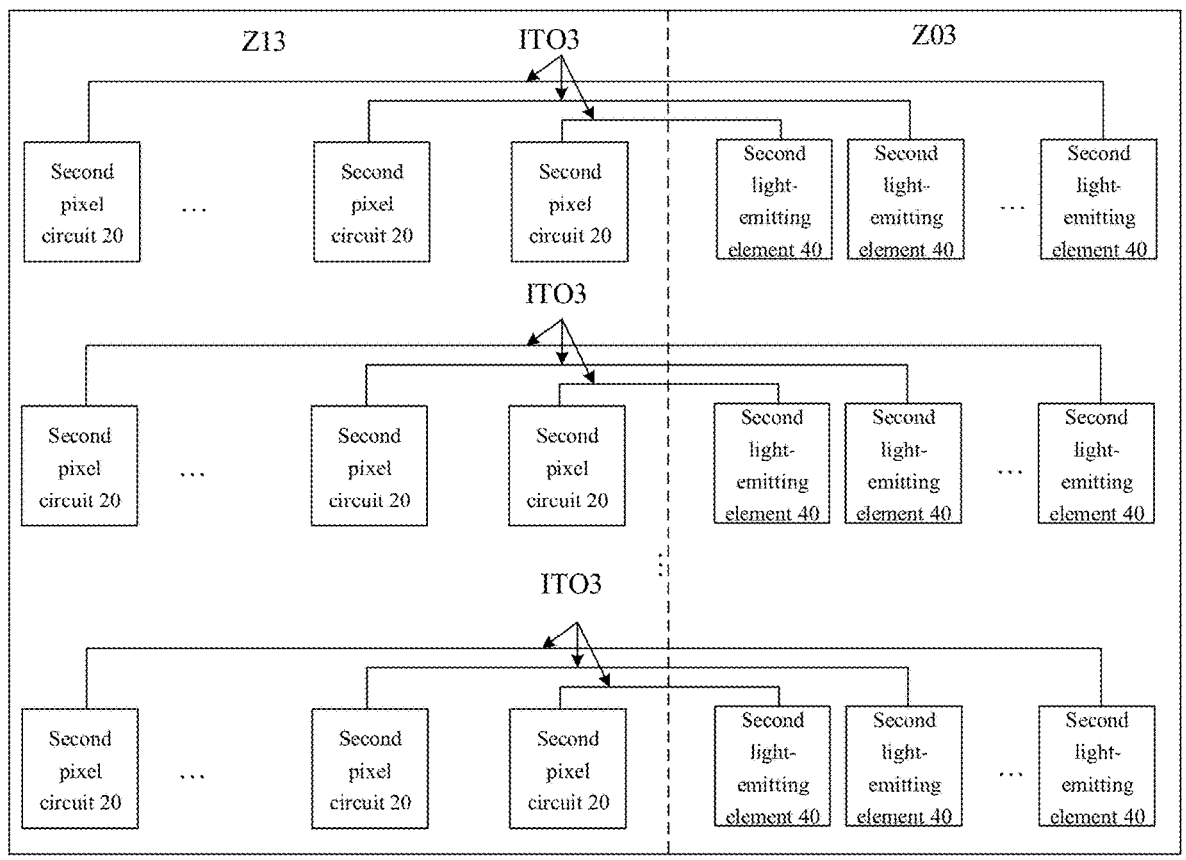
FIG. 21 is a schematic structural diagram of yet another display panel according to an embodiment of the present disclosure.

As shown in FIG. 21, the second light-emitting elements 40 in the third light-emitting element group Z03 may be connected to the second pixel circuits 20 in the third pixel circuit group Z13 by the third conductive trace L13 in one-to-one correspondence (in FIG. 21, ITO3 represents the third conductive trace L13).

Figure 22:
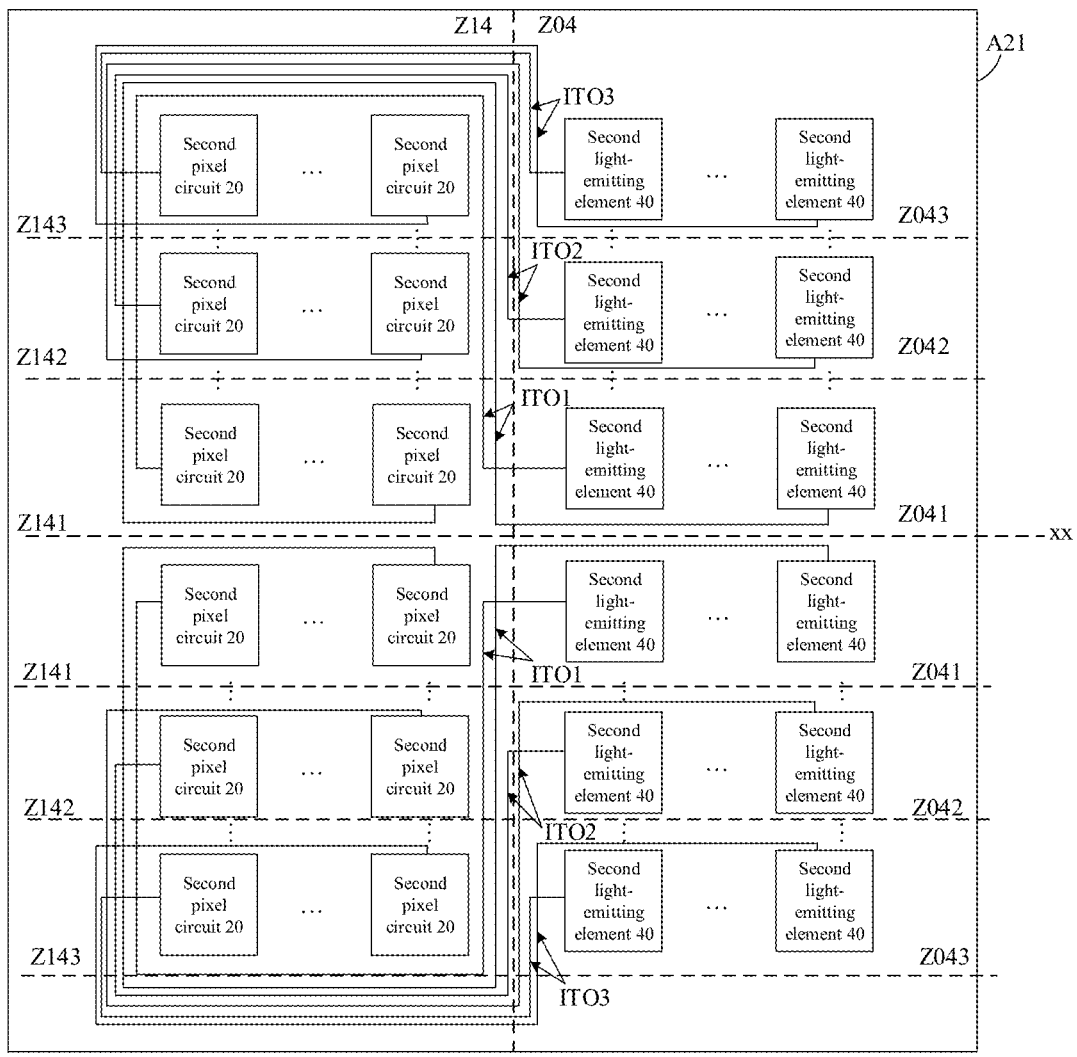
FIG. 22 is a schematic structural diagram of yet another display panel according to an embodiment of the present disclosure.

As shown in FIG. 22, the second light-emitting elements 40 in the fourth light-emitting element group Z04 may be connected to the second pixel circuits 20 in the fourth pixel circuit group Z14 by the first conductive traces L11 (that is, ITO1), the second conductive traces L12 (that is, ITO2), and the third conductive traces L13 (that is, ITO3) in one-to-one correspondence.

For example, referring to FIG. 22, the fourth light-emitting element group Z04 may include two first sub-light-emitting element groups Z041, two second sub-light-emitting element groups Z042, and two third sub-light-emitting element groups Z043 symmetrically arranged along an axis xx of the third sub-display region A21. Each of the sub-light-emitting element groups may include a plurality of rows of second light-emitting elements 40 adjacent to each other, and the number of rows of second light-emitting elements 40 included in each sub-light-emitting element group may be the same or different. In addition, the first sub-light-emitting element group Z041, the second sub-light-emitting element group Z042, and the third sub-light-emitting element group Z043 disposed on the same side may be sequentially arranged in a direction going away from the axis xx, and the axis xx extends in the second direction X2. The fourth pixel circuit group Z14 may include two first sub-pixel circuit groups Z141 in one-to-one correspondence with the two first sub-light-emitting element groups Z041, two second sub-pixel circuit groups Z142 in one-to-one correspondence with the two second sub-light-emitting element groups Z042, and two third sub-pixel circuit groups Z143 in one-to-one correspondence with the two third sub-light-emitting element groups Z043. The arrangement of the first sub-pixel circuit group Z141, the second sub-pixel circuit group Z142, and the third sub-pixel circuit group Z143 located on the same side is the same as that of the sub-light-emitting element groups.

The second light-emitting elements 40 in each of the two first sub-light-emitting element groups Z041 may be connected to the second pixel circuits 20 in a corresponding first sub-pixel circuit group Z141 by the first conductive traces L11 (that is, ITO1) in one-to-one correspondence. The second light-emitting elements 40 in each of the second sub-light-emitting element groups Z042 may be connected to the second pixel circuits 20 in a corresponding second sub-pixel circuit group Z142 by the second conductive traces L12 (that is, ITO2) in one-to-one correspondence. The second light-emitting elements 40 in each of the third sub-light-emitting element groups Z043 may be connected to the second pixel circuits 20 in a corresponding third sub-pixel circuit group Z143 by the third conductive traces L13 (that is, ITO3) in one-to-one correspondence.

Figure 23:
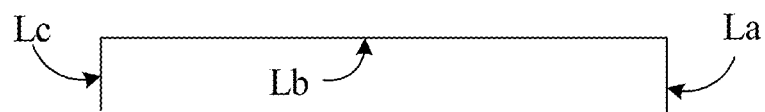
FIG. 23 is a schematic structural diagram of a conductive trace according to an embodiment of the present disclosure.
Figure 24:
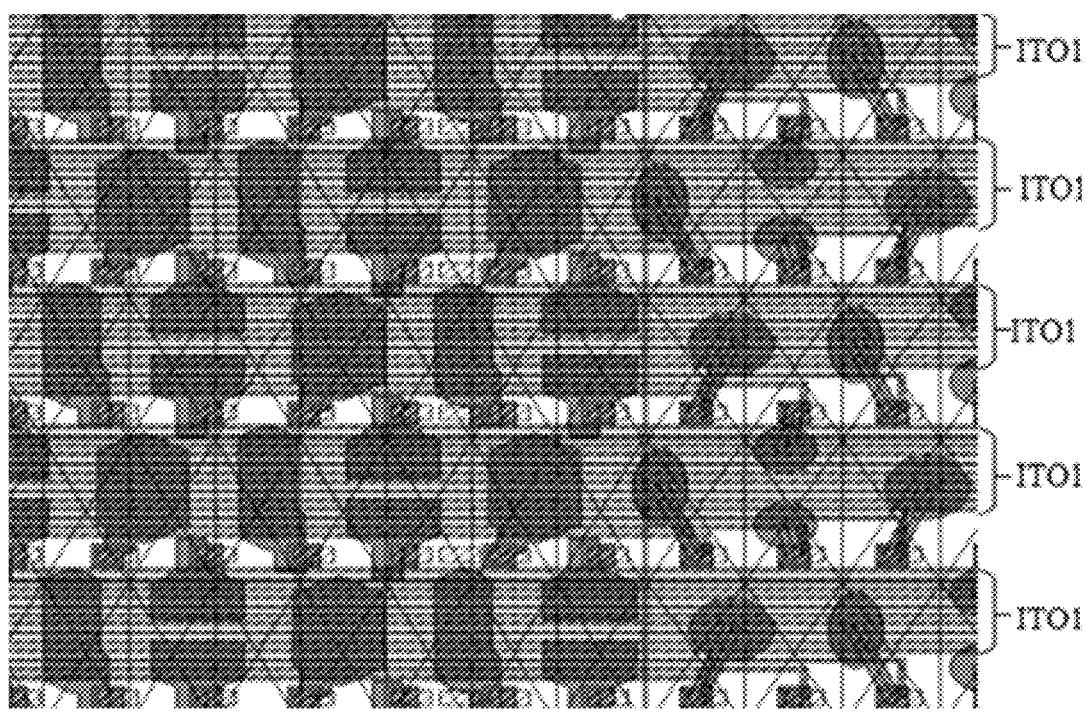
FIG. 24 is a schematic structural diagram of a conductive trace according to an embodiment of the present disclosure.

FIG. 23 is a schematic structural diagram of a conductive trace according to an embodiment of the present disclosure. FIG. 24 shows a structural layout shown in FIG. 19 to FIG. 21. Combined with FIG. 19 to FIG. 21, it can be seen that each of the first conductive trace L11 connected to the second light-emitting element 40 in the first light-emitting element group Z01, the second conductive trace L12 connected to the second light-emitting element 40 in the second light-emitting element group Z02, and the third conductive trace L13 connected to the second light-emitting element 40 in the third light-emitting element group Z03 may include a first conductive trace segment La, a second conductive trace segment Lb, and a third conductive trace segment Lc.

One end of the first conductive trace segment La may be connected to a corresponding second light-emitting element 40, and the other end of the first conductive trace segment La may be connected to one end of the second conductive trace segment Lb. The other end of the second conductive trace segment Lb may be connected to one end of the third conductive trace segment Lc. The other end of the third conductive trace segment Lc may be connected to a corresponding second pixel circuit 20. In addition, the first conductive trace segment La and the third conductive trace segment Lc may extend in the first direction X1, the second conductive trace segment Lb may extend in the second direction X2, and an orthographic projection of the second conductive trace segment Lb on the base substrate 01 is at least partially overlapped with an orthographic projection of the second light-emitting element 40 on the base substrate 01 (as can be seen with reference to FIG. 24 described below). That is, the first conductive trace L11, the second conductive trace L12, and the third conductive trace L13 may all be led out from the connected second light-emitting element 40 and transversely extend in the row direction to the position of the second pixel circuit 20 to be connected to the second pixel circuit 20.

Optionally, to prevent signals from interfering with each other, the second conductive trace segment Lb in the first conductive trace L11 may be at least partially overlapped with the second conductive trace segment Lb in the third conductive trace L13. The second conductive trace segment Lb in the first conductive trace L11 may be not overlapped with the second conductive trace segment Lb in the second conductive trace L12, and the second conductive trace segment Lb in the third conductive trace L13 may also be not overlapped with the second conductive trace segment Lb in the second conductive trace L12. The overlapping parts may be transferred through vias.

It needs to be noted that FIG. 24 only schematically shows a structural layout of the first conductive traces L11 connected to the second light-emitting elements 40 in the first light-emitting element group Z01, that is, ITO1 traces, in the display panel. For the structural layouts of the second conductive trace L12 (that is, the ITO2 trace) connected to the second light-emitting elements 40 in the second light-emitting element group Z02 and the third conductive trace L13 (that is, the ITO3 trace) connected to the second light-emitting elements 40 in the third light-emitting element group Z03 in the display panel, reference may directly be made to the schematic diagram of the display panel in FIG. 24, and details are not described herein again.

Figure 25:
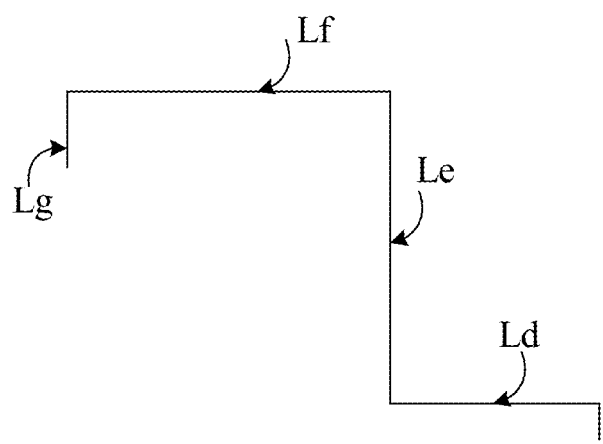
FIG. 25 is a schematic structural diagram of a conductive trace according to an embodiment of the present disclosure.

Optionally, FIG. 25 is a schematic structural diagram of a conductive trace according to an embodiment of the present disclosure. As shown in FIG. 25, each of the first conductive trace L11 connected to the second light-emitting element 40 in each first sub-light-emitting element group Z041, the second conductive trace L12 connected to the second light-emitting element 40 in each second sub-light-emitting element group Z042, and the third conductive trace L13 connected to the second light-emitting element 40 in each third sub-light-emitting element group Z043 may include a fourth conductive trace segment Ld, a fifth conductive trace segment Le, a sixth conductive trace segment Lf, and a seventh conductive trace segment Lg.

One end of the fourth conductive trace segment Ld may be connected to a corresponding second light-emitting element 40, and the other end of the fourth conductive trace segment Ld may be connected to one end of the fifth conductive trace segment Le. The other end of the fifth conductive trace segment Le may be connected to one end of the sixth conductive trace segment Lf. The other end of the sixth conductive trace segment Lf may be connected to one end of the seventh conductive trace segment Lg. The other end of the seventh conductive trace segment Lg may be connected to a corresponding second pixel circuit 20. In addition, the fifth conductive trace segment Le and the seventh conductive trace segment Lg may extend in the first direction X1, and the sixth conductive trace segment Lf may extend in the second direction X2. The fourth conductive trace segment Ld may be located between a row in which the connected second light-emitting element 40 is located and an adjacent row.

Figure 26:
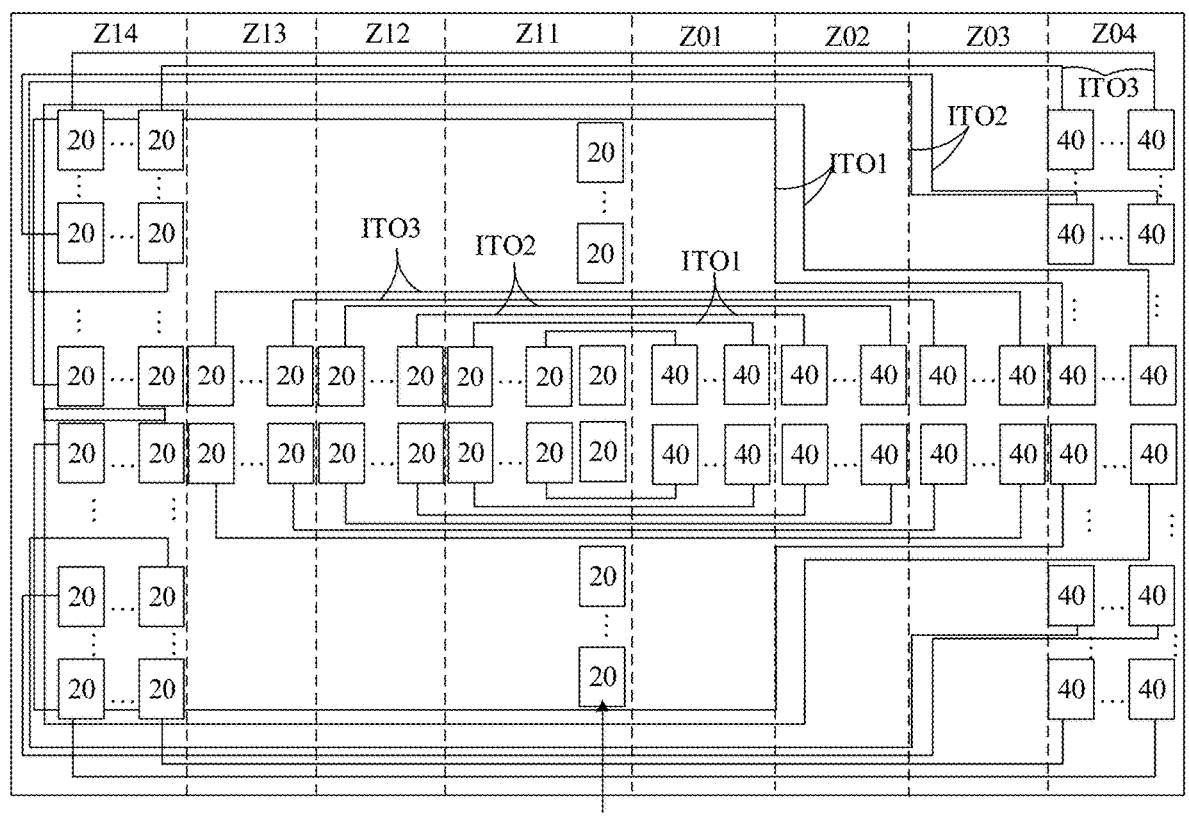
FIG. 26 is a schematic structural diagram of yet another display panel according to an embodiment of the present disclosure.
Figure 27:
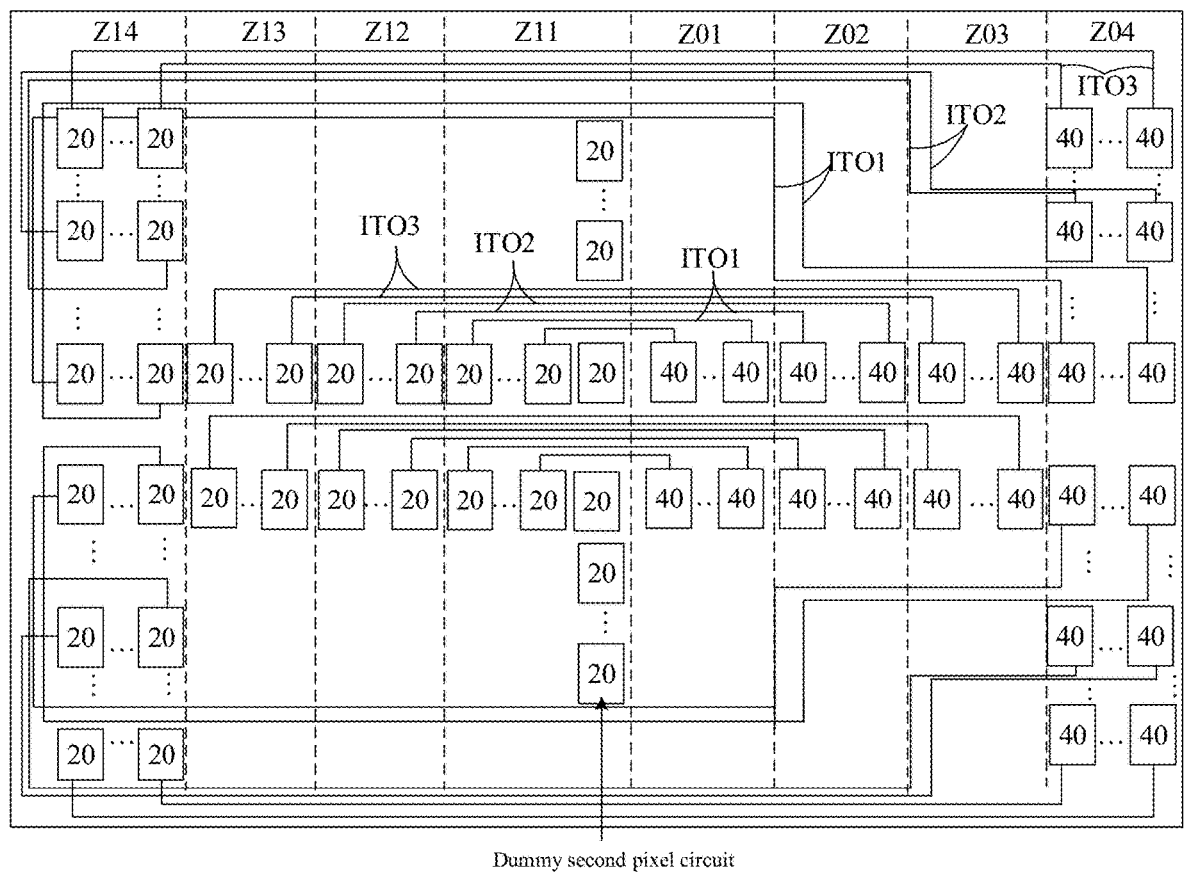
FIG. 27 is a schematic structural diagram of yet another display panel according to an embodiment of the present disclosure.
Figure 28:
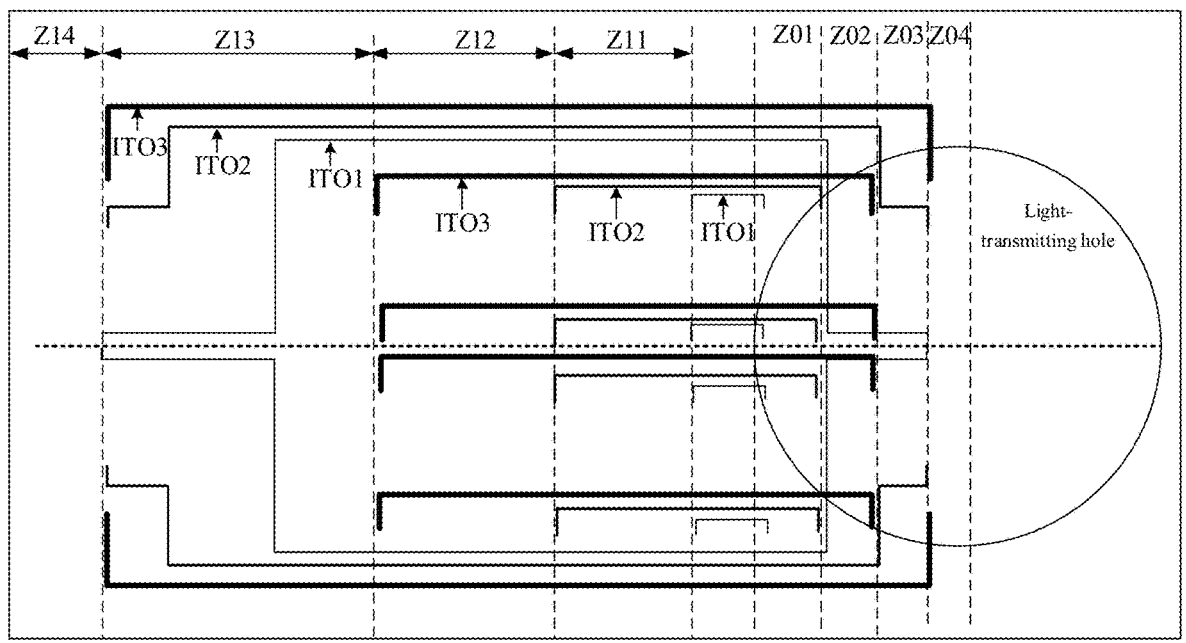
FIG. 28 is a schematic structural diagram of yet another display panel according to an embodiment of the present disclosure.

FIG. 26 is a schematic structural diagram of yet another display panel according to an embodiment of the present disclosure, FIG. 27 is a schematic structural diagram of yet another display panel according to an embodiment of the present disclosure, and FIG. 28 is a simplified schematic diagram of the display panel shown in FIG. 27. Combined with FIG. 26 to FIG. 28, it can be seen that the fifth conductive trace segment Le included in the first conductive trace L11 (that is, ITO1 in the figure) may be located in a region in which the second light-emitting element group Z02 to the fourth light-emitting element group Z04 are located. The fifth conductive trace segment Le included in the second conductive trace L12 (that is, ITO2 in the figure) may be located in a region in which the third light-emitting element group Z03 to the fourth light-emitting element group Z04 are located. The fifth conductive trace segment Le included in the third conductive trace L13 (that is, ITO3 in the figure) may be located in a region in which the fourth light-emitting element group Z04 is located. The sixth conductive trace segment Lf on a side, distal from the second sub-display region A12, of the axis, may be located on a side, distal from the second sub-display region A12, of the second display region A2, and the sixth conductive trace segment Lf on a side, proximal to the second sub-display region A12, of the axis, is located in the second display region A2 proximal to the second sub-display region A12.

That is, the fifth conductive trace segment Le included in the first conductive trace L11 may be led out from the connected second light-emitting element 40, and extend in the column direction from a region (that is, a region in which Z02 to Z04 are located) in which the R14 to R48 columns of second light-emitting elements 40 are located on a side, proximal to a non-display region or proximal to the second sub-display region A12, of the third sub-display region A21, and then transversely extends in the row direction to a region in which a corresponding second pixel circuit 20 is located, to be connected to the second pixel circuit 20. The fifth conductive trace segment Le included in the second conductive trace L12 may be led out from the connected second light-emitting element 40, and extend in the column direction from a region (that is, a region in which Z03 and Z04 are located) in which the R27 to R48 columns of second light-emitting elements 40 are located to a side, proximal to a non-display region or proximal to the second sub-display region A12, of the third sub-display region A21, and then transversely extends in the row direction to a region in which a corresponding second pixel circuit 20 is located, to be connected to the second pixel circuit 20. The fifth conductive trace segment Le included in the third conductive trace L13 may be led out from the connected second light-emitting element 40, and extend in the column direction from a region (that is, a region in which Z04 is located) in which the R40 to R48 columns of second light-emitting elements 40 are located to a side, proximal to a non-display region or proximal to the second sub-display region A12, of the third sub-display region A21, and then transversely extends in the row direction to a region in which a corresponding second pixel circuit 20 is located, to be connected to the second pixel circuit 20. In addition, the sixth conductive trace segments Lf included in the conductive traces located on the same side and extending in the row direction may partially overlap or may not overlap.

With reference to FIG. 26 and FIG. 27, it can be seen that the display panel may further include at least one column of dummy second pixel circuits 20. At least one column of dummy second pixel circuits 20 may be disposed in the target sub-display regions A110. The column of dummy second pixel circuits 20 may also be referred to as a transition column. The column of dummy second pixel circuits 20 is not connected to any light-emitting element.

By arranging the transition column, the problem that a turn-on time difference between the first column of second light-emitting elements 40 and the last column of second light-emitting elements 40 is relatively large since a distance between the first column of second light-emitting elements 40 and the second pixel circuit 20 connected to the first column of second light-emitting elements 40 is less than a distance between the last column of second light-emitting elements 40 and the second pixel circuit 20 connected to the last column of second light-emitting elements 40 can be avoided, which further ensures a better display effect.

In addition, by comparing FIG. 26 and FIG. 27, it can be seen that in the first light-emitting element group 01, the first conductive traces L11 (that is, ITO1 in the figure) connected to the second light-emitting elements 40 located in adjacent rows may be disposed on the same side facing upward or may be symmetrically arranged on different sides. In the second light-emitting element group 01, the second conductive traces L12 (that is, ITO2 in the figure) connected to the second light-emitting elements 40 located in adjacent rows may be located on the same side facing upward or may be symmetrically arranged on different sides. In the third light-emitting element group 01, the third conductive traces L13 (that is, ITO1 in the figure) connected to the second light-emitting elements 40 located in adjacent rows may be located on the same side facing upward or may be symmetrically arranged on different sides. Alternatively, the foregoing signal lines may also be both located on the same side facing downward, and details are no longer described with reference to the accompanying drawings.

Figure 29:
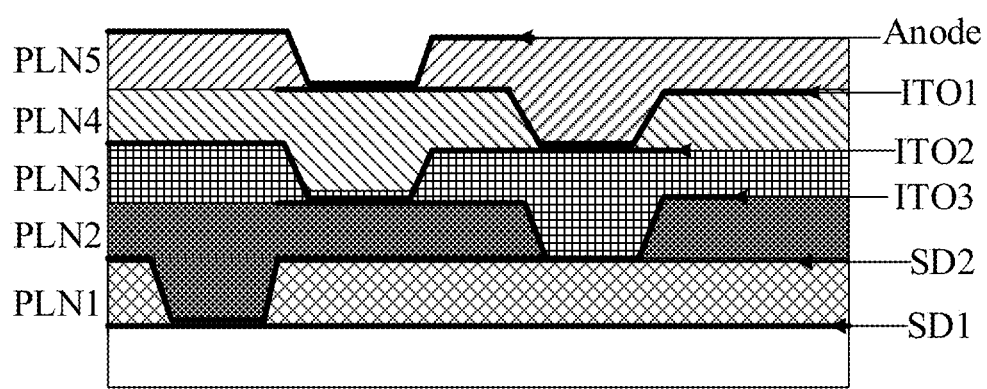
FIG. 29 is a sectional view of a display panel according to an embodiment of the present disclosure.

FIG. 29 is a sectional view of a display panel. ITO1 represents the first conductive trace L11, ITO2 represents the second conductive trace L12, and ITO3 represents the third conductive trace L13. Anode refers to an anode of a light-emitting element, and PLN refers to a planarization layer. The display panel shown in FIG. 29 includes a total of five planarization layers PLN1 to PLN5. SD1 refers to a first source-drain metal layer, and SD2 refers to a second source-drain metal layer.

Optionally, the display panel may further include a plurality of metal layers such as a first gate metal layer GATE1, a second gate metal layer GATE2, a first source-drain metal layer SD1, and the second source-drain metal layer SD2. A data trace DATA connected to each second pixel circuit 20 and any metal layer may be disposed in the same layer.

Figure 30:
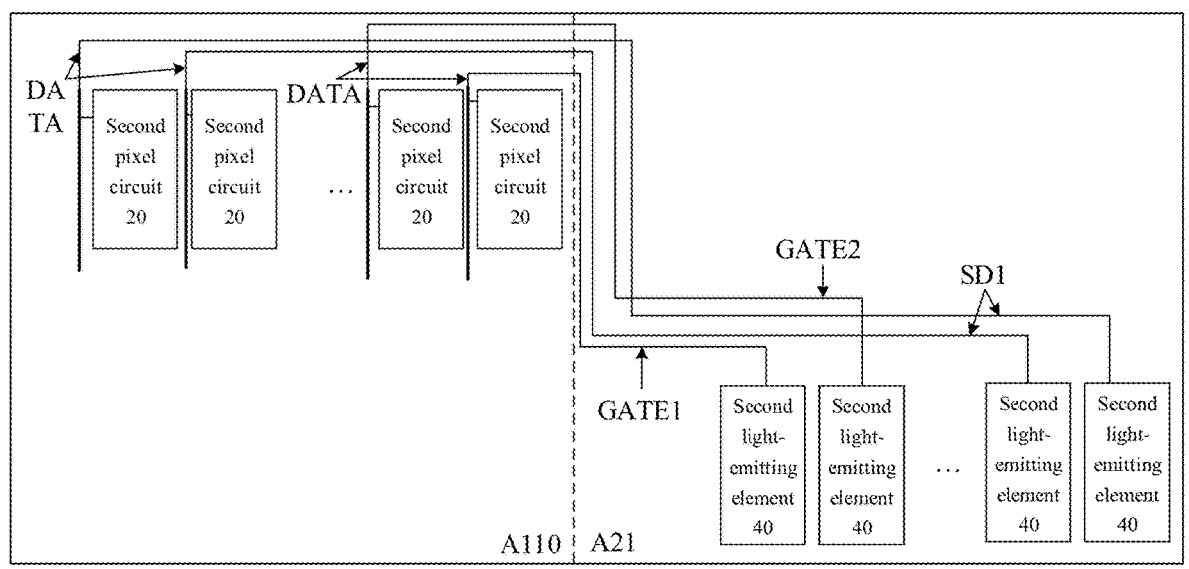
FIG. 30 is a schematic structural diagram of yet another display panel according to an embodiment of the present disclosure.

For example, referring to the display panel shown in FIG. 30, in the direction going away from the adjacent third sub-display region A21, in the first column to an $i^{th}$ column of second pixel circuits 20 in each target sub-display region A110, the data trace DATA connected to the second pixel circuits 20 disposed in an odd-numbered column and the first gate metal layer GATE1 may be disposed in the same layer. A data trace DATA connected to the second pixel circuits 20 disposed in an even-numbered column and the second gate metal layer GATE2 may be disposed in the same layer. A data trace DATA connected to the $i^{th}$ column to an $n^{th}$ column of second pixel circuits 20 and the first source-drain metal layer SD1 may be disposed in the same layer. i may be an integer greater than 1 and less than n, and n may be equal to a total quantity of columns in each target sub-display region A110. That is, data traces DATA connected to the first i columns of second pixel circuits 20 may be alternately disposed in the same layer as GATE1 and GATE2. All data traces DATA connected to the $i^{th}$ column to the $n^{th}$ column of second pixel circuits 20 and SD1 may be disposed in the same layer.

Optionally, assuming that the third sub-display region A21 includes 48 columns of second light-emitting elements 40, i may be 24. That is, every 24 columns of second light-emitting elements 40 may be one group. Correspondingly, that is, in the first column to the $24^{th}$ column, a data trace DATA connected to the odd-numbered column and the first gate metal layer GATE1 may be disposed in the same layer. From the first column to the $24^{th}$ column, a data trace DATA connected to the even-numbered column and the second gate metal layer GATE2 may be disposed in the same layer, and data traces DATA connected to the $24^{th}$ column to the $48^{th}$ column and the first source-drain metal layer SD1 are disposed in the same layer.

Figure 31:
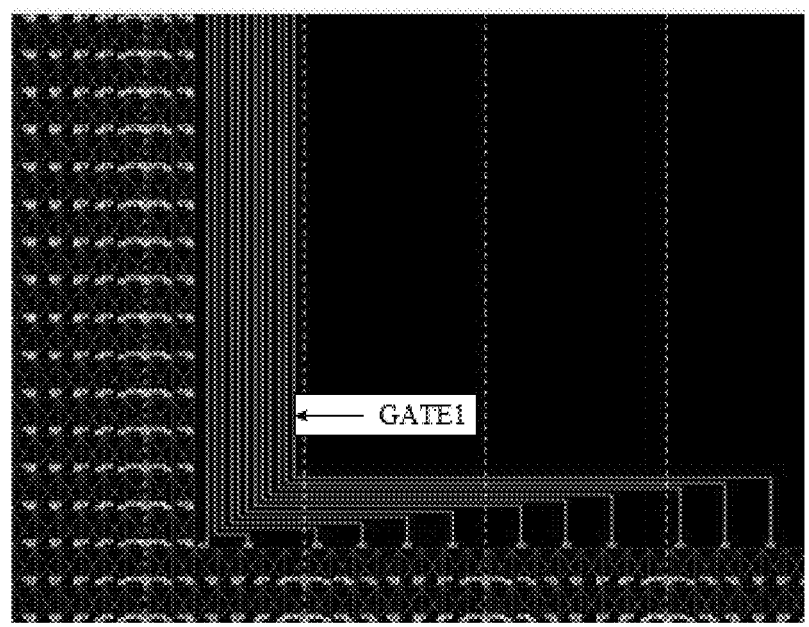
FIG. 31 is a schematic structural diagram of yet another display panel according to an embodiment of the present disclosure.
Figure 32:
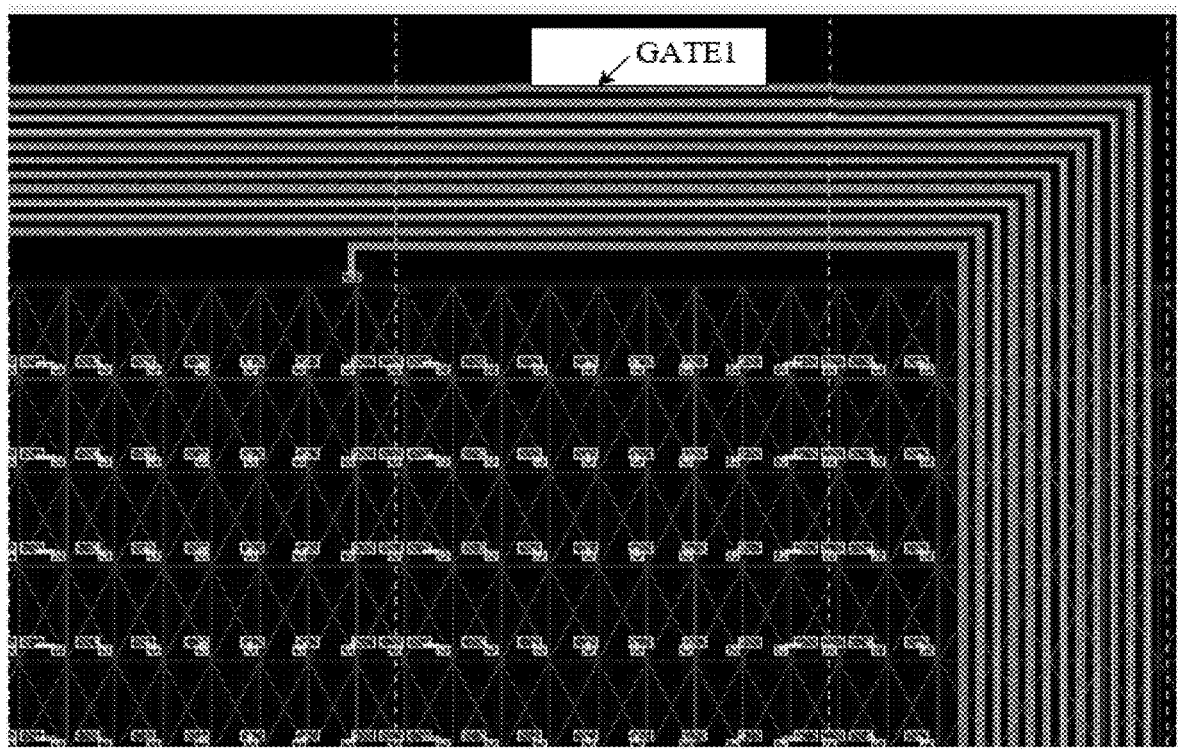
FIG. 32 is a schematic structural diagram of yet another display panel according to an embodiment of the present disclosure.
Figure 33:
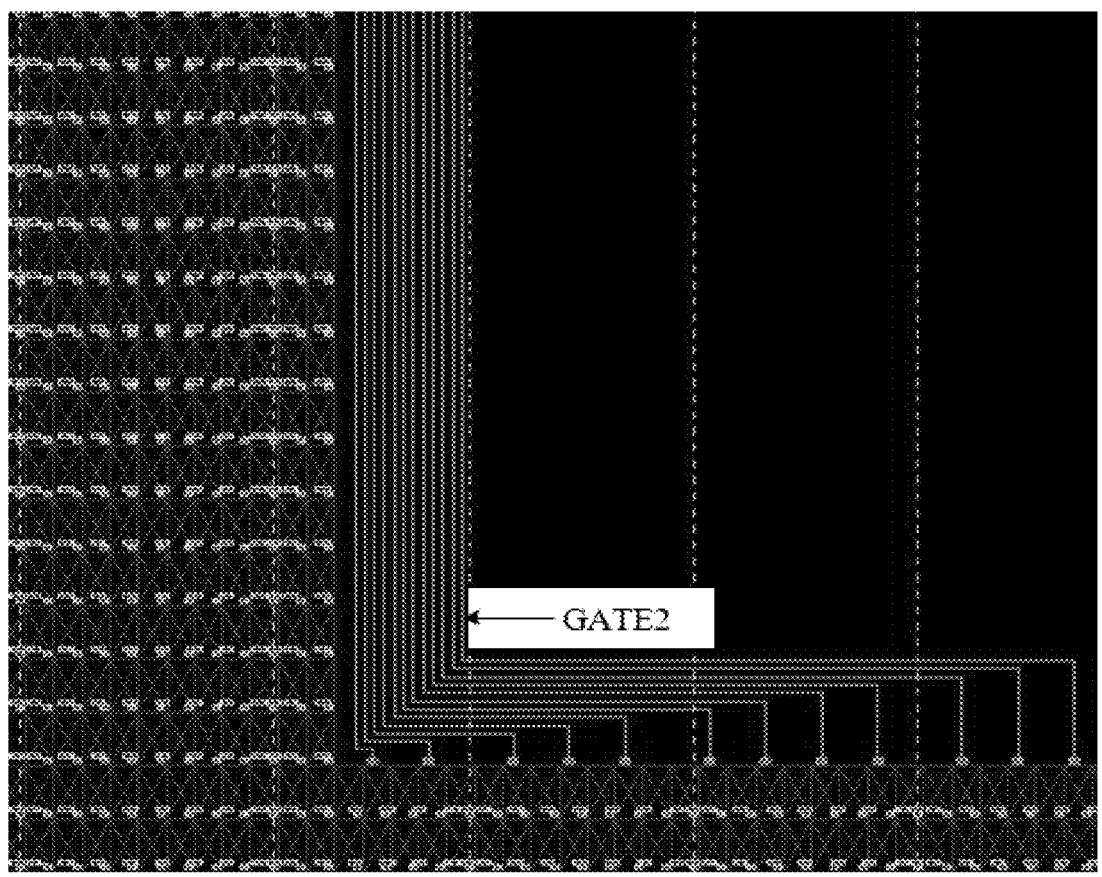
FIG. 33 is a schematic structural diagram of yet another display panel according to an embodiment of the present disclosure.
Figure 34:
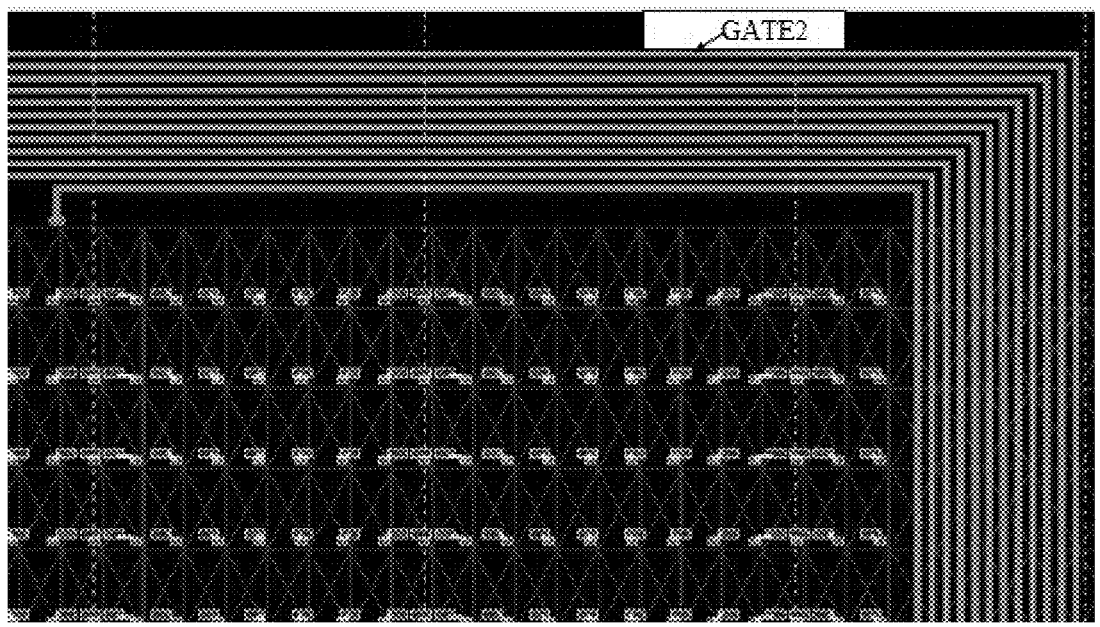
FIG. 34 is a schematic structural diagram of yet another display panel according to an embodiment of the present disclosure.
Figure 35:
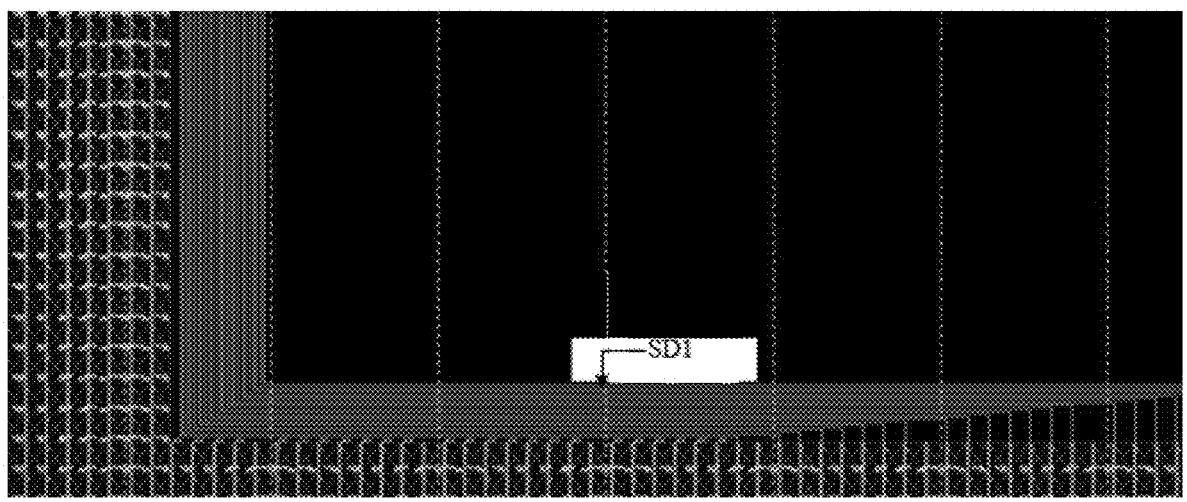
FIG. 35 is a schematic structural diagram of yet another display panel according to an embodiment of the present disclosure.
Figure 36:
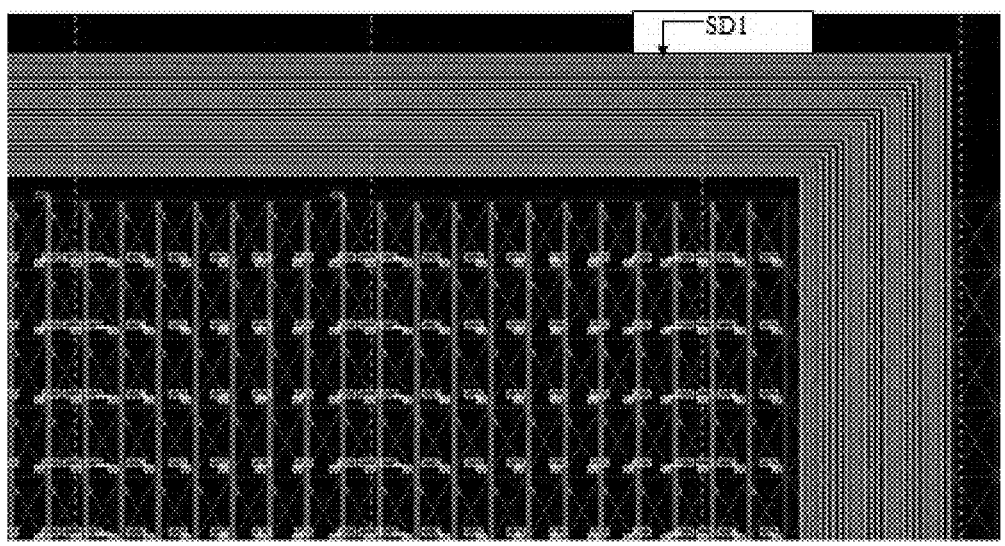
FIG. 36 is a schematic structural diagram of yet another display panel according to an embodiment of the present disclosure.
Figure 37:
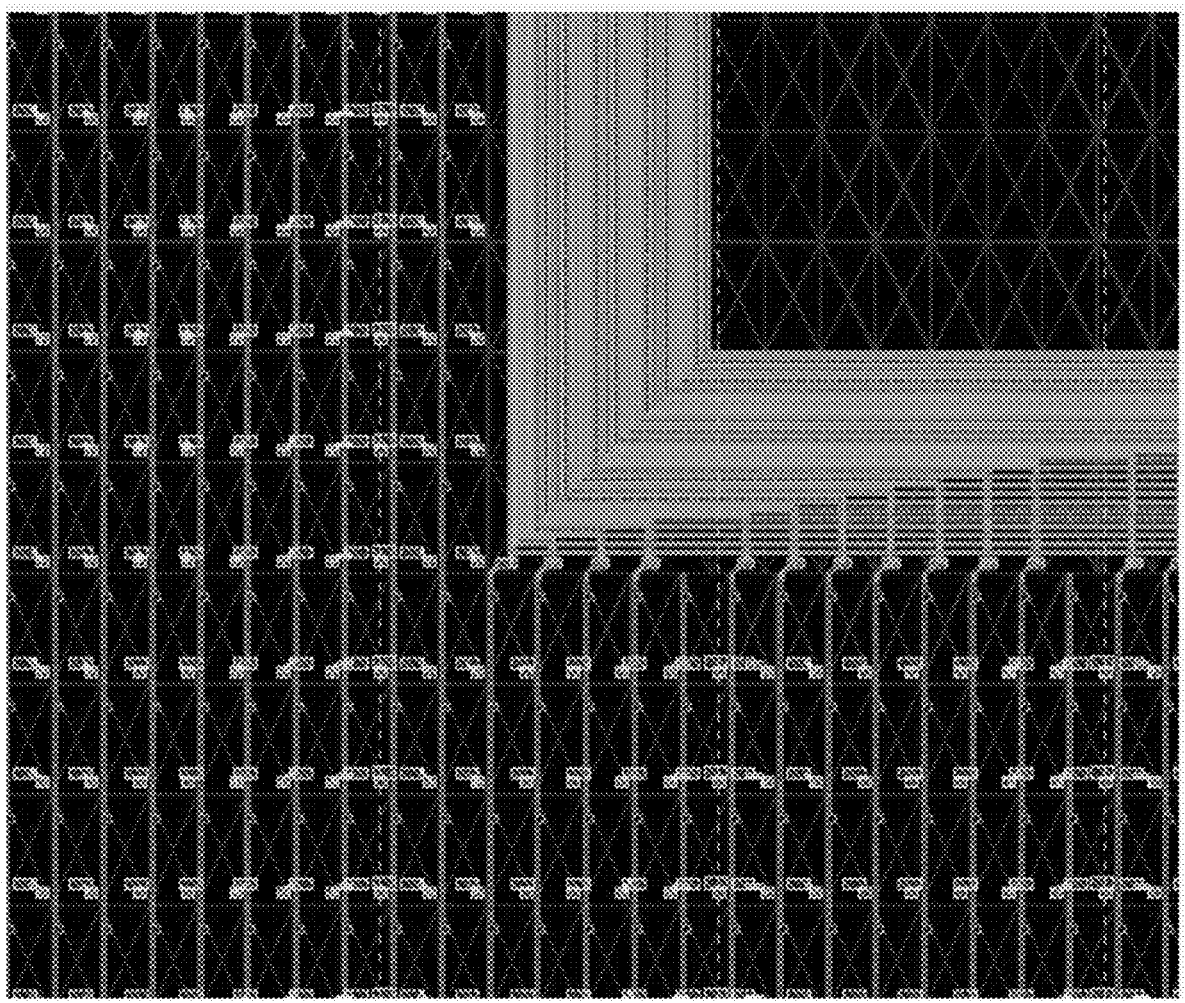
FIG. 37 is a schematic structural diagram of yet another display panel according to an embodiment of the present disclosure.
Figure 38:
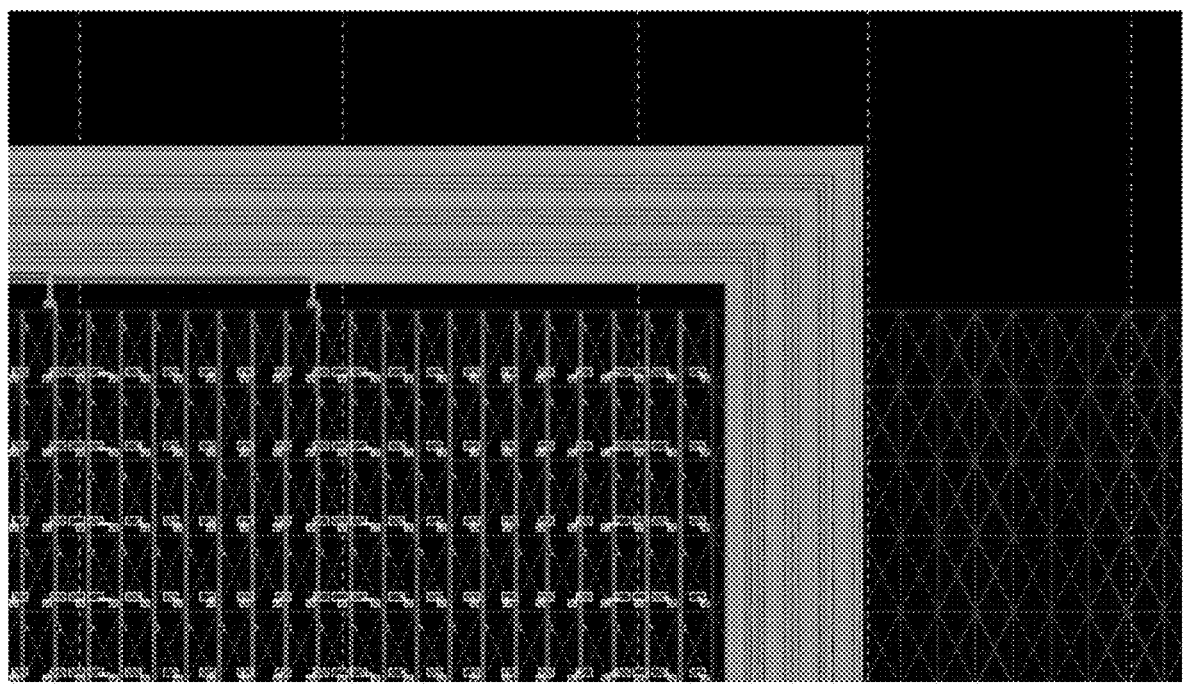
FIG. 38 is a schematic structural diagram of yet another display panel according to an embodiment of the present disclosure.
Figure 39:
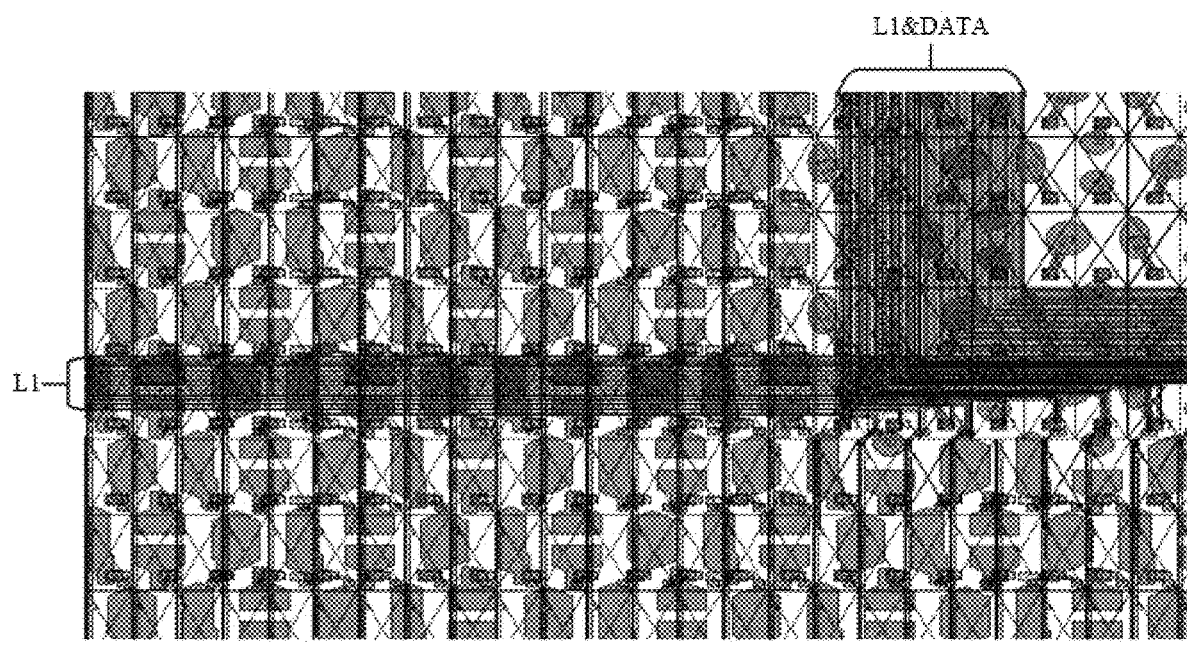
FIG. 39 is a schematic structural diagram of yet another display panel according to an embodiment of the present disclosure.
Figure 40:
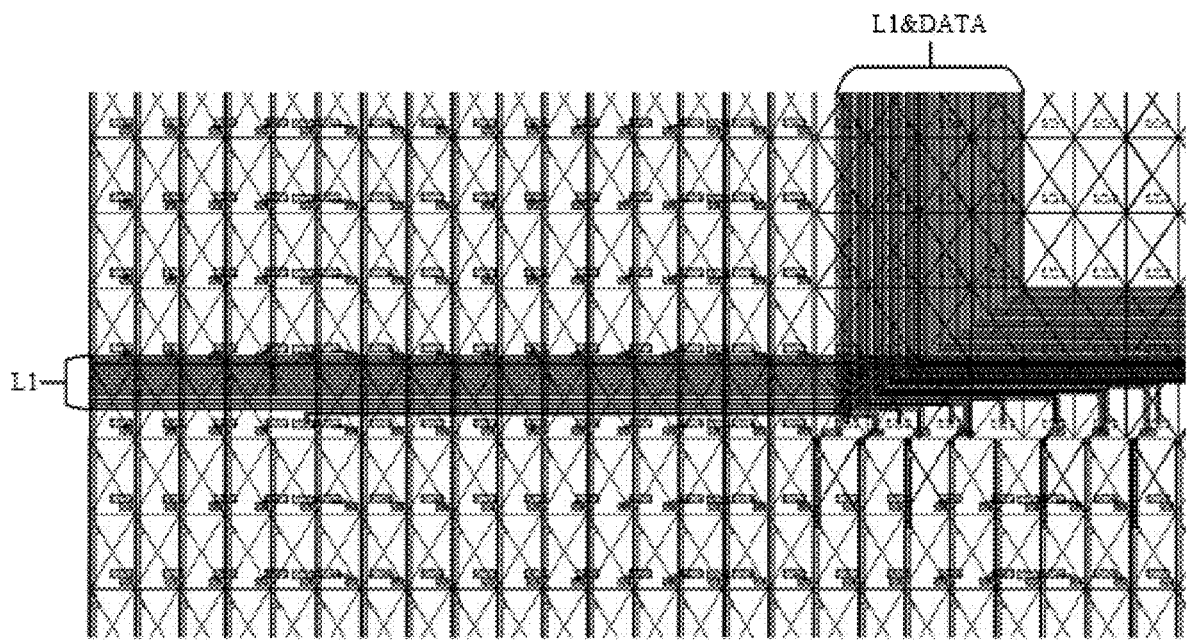
FIG. 40 is a schematic structural diagram of yet another display panel according to an embodiment of the present disclosure.

Optionally, FIG. 31 and FIG. 32 show structural layouts in which at different positions, a data trace DATA connected to an odd-numbered column of second pixel circuits 20 and the first gate metal layer GATE1 are disposed in the same layer. FIG. 33 and FIG. 34 show structural layouts in which at different positions, a data trace DATA connected to an even-numbered column of second pixel circuits 20 and the second gate metal layer GATE2 are disposed in the same layer. FIG. 35 and FIG. 36 show structural layouts in which at different positions, a data trace DATA connected to the $i^{th}$ column to the $n^{th}$ column of second pixel circuits 20 and SD1 are disposed in the same layer. FIG. 37 and FIG. 38 show an overall layout of a display panel that at different positions, data traces DATA and the first gate metal layer GATE1 are disposed in the same layer, data traces DATA and the second gate metal layer GATE2 are disposed in the same layer, and data traces DATA and SD1 are disposed in the same layer. FIG. 39 and FIG. 40 show a structural layout including a conductive trace L1 and a data trace DATA.

Figure 41:
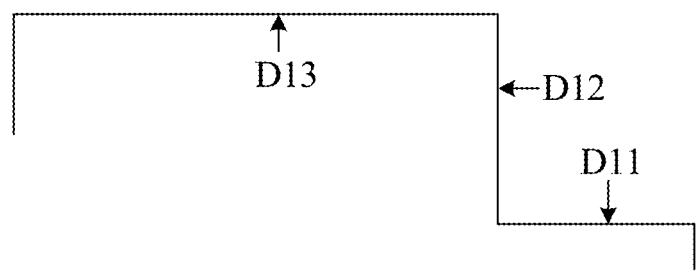
FIG. 41 is a schematic structural diagram of a data trace according to an embodiment of the present disclosure.

FIG. 41 is a schematic structural diagram of a data trace. Combined with the accompanying drawings related to the foregoing data traces, it can be seen that a data trace DATA connected to each second pixel circuit 20 may include a first data trace segment D11, a second data trace segment D12, and a third data trace segment D13.

One end of the first data trace segment D11 may be connected to a corresponding metal layer, the other end of the first data trace segment D11 may be connected to one end of the second data trace segment D12, the other end of the second data trace segment D12 may be connected to one end of the third data trace segment D13, and the other end of the third data trace segment D13 may be connected to the second pixel circuit 20.

In addition, the second data trace segment D12 may extend in the first direction X1, and the second data trace segment D12 included in the data trace DATA in the same layer as the first gate metal layer GATE1, the second data trace segment D12 included in the data trace DATA in the same layer as the second gate metal layer GATE2, and the second data trace segment D12 included in the data trace DATA in the same layer as the first source-drain metal layer SD1 maybe not overlapped with each other. That is, each data trace DATA may be transferred and led out from a metal layer at a borderline between the third sub-display region A21 and the second sub-display region A12, extends in the column direction from a display region to a non-display region in the third sub-display region A21, then extends in the row direction to a corresponding column of second pixel circuits 20, and is connected to the second pixel circuit 20.

Figure 42:
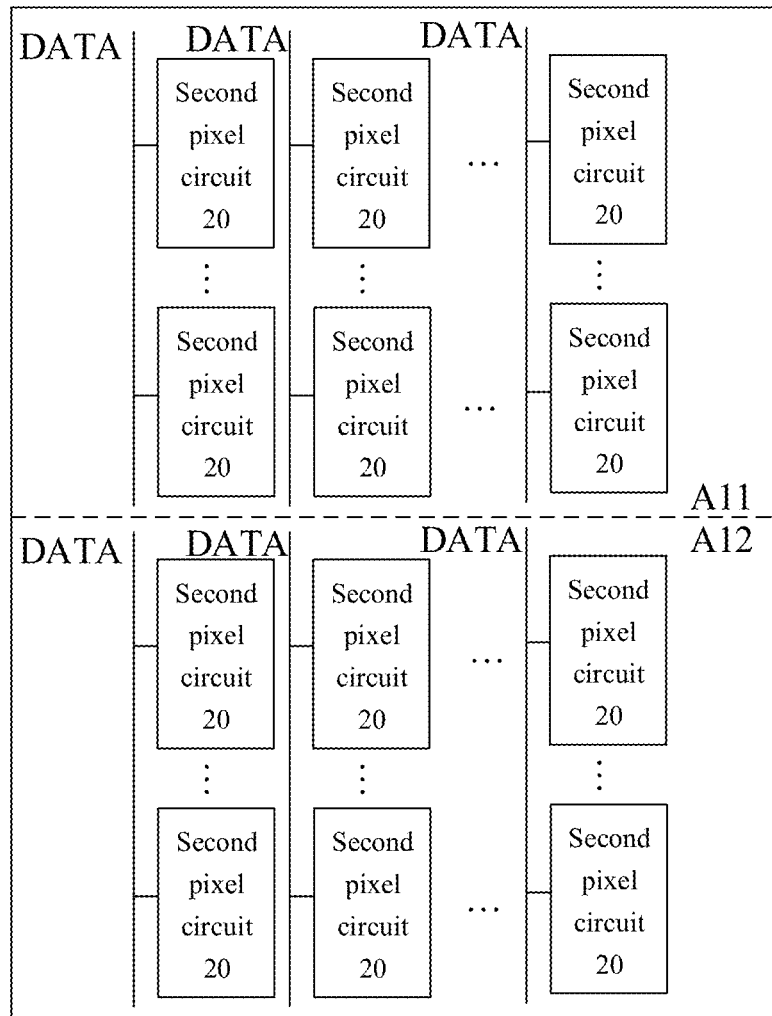
FIG. 42 is a schematic structural diagram of yet another display panel according to an embodiment of the present disclosure.

In addition, combined with the display panel shown in FIG. 42, in the same column of second pixel circuits 20, the data trace DATA connected to the second pixel circuits 20 located in the first sub-display region A11 may be different from the data trace DATA connected to the second pixel circuits 20 located in the second sub-display region A12. For example, a data trace DATA connected to one column of second pixel circuits 20 is disconnected from a borderline between the first sub-display region A11 and the second sub-display region A12. In this way, signals provided by data traces can be prevented from interfering with each other, to ensure effective and reliable driving of the second light-emitting elements 40.

Figure 43:
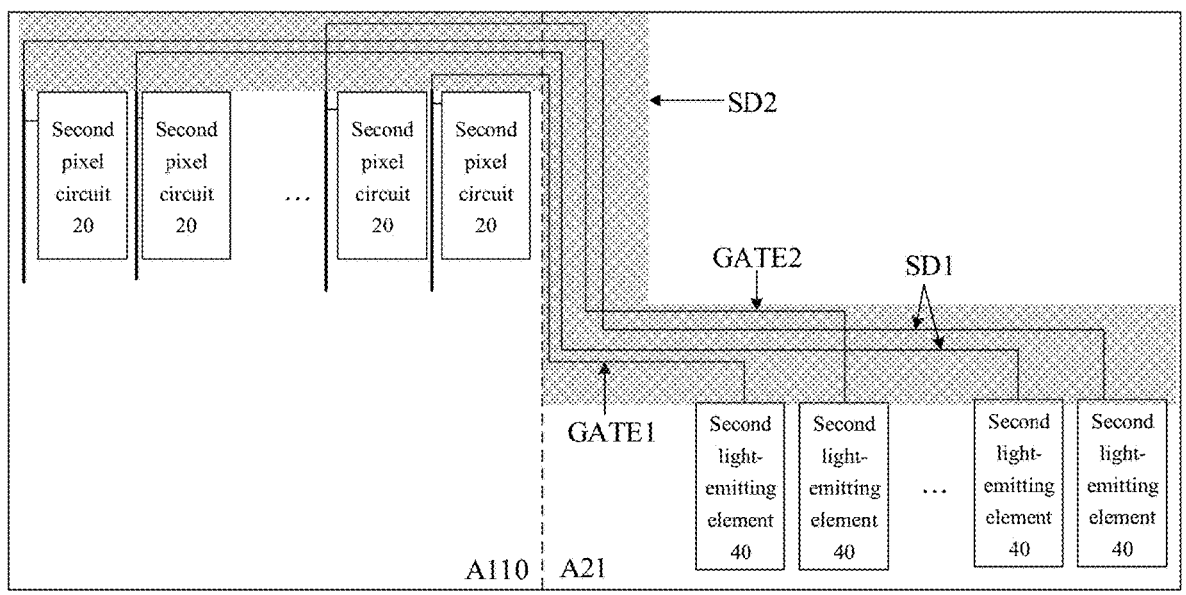
FIG. 43 is a schematic structural diagram of yet another display panel according to an embodiment of the present disclosure.

Moreover, with reference to the display panel shown in FIG. 43, the first gate metal layer GATE1, the second gate metal layer GATE2, and the first source-drain metal layer SD1 may be covered by the second source-drain metal layer SD2. Thus, signal shielding at a connecting point between a driving transistor and a light-emitting element can be achieved, thereby reducing signal crosstalk.

The influence of parasitic capacitance on the conductive trace L1 can be shielded to a certain extent, and a good display effect is ensured.

In summary, the embodiments of the present disclosure provide a display panel. The display panel includes a base substrate including a first display region and a second display region. Since pixel circuits for driving light-emitting elements in the second display region are only disposed in the first display region but not disposed in the second display region, the light transmittance of the second display region is ensured to be good. Correspondingly, the display panel described in the embodiments of the present disclosure has a good display effect.

Figure 44:
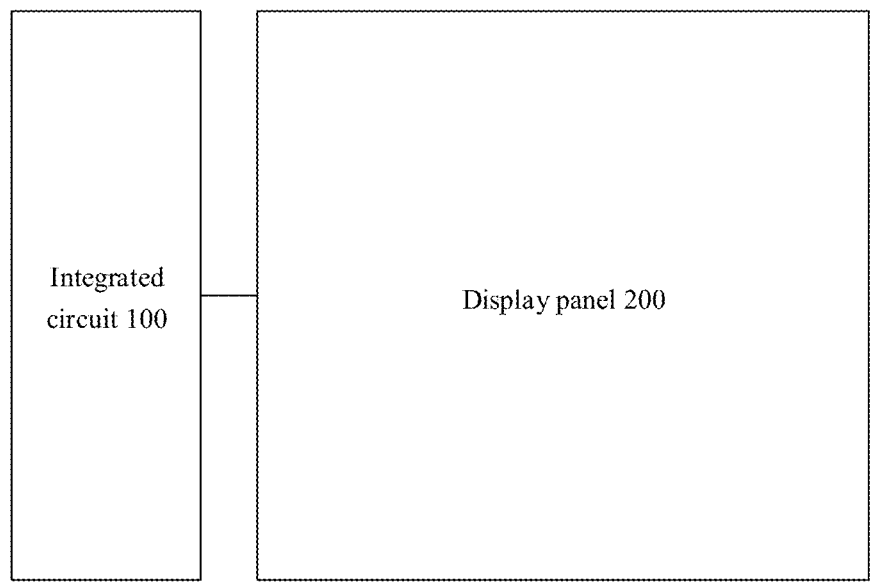
FIG. 44 is a schematic structural diagram of a display device according to an embodiment of the present disclosure.

FIG. 44 is a schematic structural diagram of a display device according to an embodiment of the present disclosure. As shown in FIG. 44, the display device may include an integrated circuit 100 and the display panel 200 shown in any foregoing drawing.

The integrated circuit 100 may be connected to a first pixel circuit and a second pixel circuit in the display panel 200 and may be configured to drive the first pixel circuit and the second pixel circuit. For example, the driving circuit 100 may be connected to signal terminals connected to pixel circuits and used for providing signals to the signal terminals.

It needs to be noted that FIG. 44 only schematically shows the position of the integrated circuit 100. The integrated circuit 100 may be alternatively located on the right side of the display panel 200 or maybe both located on the left side of the display panel 200 and located on the right side of the display panel 200. Alternatively, the integrated circuit 100 may be located on an upper side and/or a lower side of the display panel 200.

Optionally, the display device may be any product or part provided with a display function, such as an organic light-emitting diode (OLED) display device, an active-matrix OLED (AMOLED) display device, a mobile phone, a tablet computer, a flexible display device, a television, or a display.

It may be clearly understood by a person skilled in the art that, for a convenient and brief description, for a detailed working process of the foregoing display substrate and display device, reference may be made to a corresponding process in the foregoing method embodiments, and details are not described herein again.

Described above are merely exemplary embodiments of the present disclosure, and are not intended to limit the present disclosure. Within the spirit and principles of the disclosure, any modifications, equivalent substitutions, improvements, and the like are within the protection scope of the present disclosure.

What is claimed is:

1. A display panel, comprising:
 a base substrate comprising a first display region and a second display region, wherein the first display region is at least partially disposed around the second display region, and the first display region comprises a first sub-display region and a second sub-display region sequentially arranged in a first direction;
 a plurality of first pixel circuits, a plurality of second pixel circuits, and a plurality of first light-emitting elements, wherein the plurality of first pixel circuits, the plurality of second pixel circuits, and the plurality of first light-emitting elements are disposed in the first display region, the plurality of second pixel circuits are disposed at intervals among the plurality of first pixel circuits, the plurality of first pixel circuits comprise a plurality of columns of first pixel circuits extending in the first direction, and the plurality of second pixel circuits comprise a plurality of columns of the second pixel circuits extending in the first direction;
 a plurality of second light-emitting elements disposed in the second display region;
 at least one dummy column located in the second sub-display region of the first display region; and
 at least one column of dummy second pixel circuits, wherein the at least one column of dummy second pixel circuits is disposed in a target sub-display region proximal to the second display region, and the at least one column of dummy second pixel circuit is located between two adjacent columns of the first pixel circuits, wherein the first sub-display region comprises two symmetrical target sub-display regions;
 wherein at least one first pixel circuit of the plurality of first pixel circuits is connected to at least one first light-emitting element of the plurality of first light-emitting elements, an orthographic projection of the at least one first pixel circuit on the base substrate is at least partially overlapped with an orthographic projection of the at least one first light-emitting element on the base substrate, at least one second pixel circuit of the plurality of second pixel circuits is connected to at least one second light-emitting element of the plurality of second light-emitting elements by a conductive trace; at least one column of the plurality of columns of second pixel circuits extending in the first direction is located in a same column as the at least one dummy column, wherein the first direction is a direction intersecting with an extension direction of the conductive trace.

2. The display panel according to claim 1, wherein a density of the plurality of second light-emitting elements is the same as a density of the plurality of first light-emitting elements.

3. The display panel according to claim 1, wherein a resolution of the first display region is the same as a resolution of the second display region; or, a resolution of the first display region is different from a resolution of the second display region.

4. The display panel according to claim 1, wherein each of the plurality of the first pixel circuits is connected to one of the plurality of the first light-emitting elements; and
 an orthographic projection of each of the plurality of the first pixel circuits on the base substrate is at least partially overlapped with an orthographic projection of the connected first light-emitting element on the base substrate.

5. The display panel according to claim 1,
 wherein the plurality of columns of second pixel circuits are disposed at intervals among the plurality of columns of first pixel circuits, and an equal number or an unequal number of first pixel circuits are arranged between any two adjacent columns of the second pixel circuits.

6. The display panel according to claim 1,
 wherein one target sub-display region, the second display region, and the other target sub-display region are sequentially arranged in the second direction.

7. The display panel according to claim 6, wherein the second display region comprises two third sub-display regions symmetrically arranged in the second direction; and the display panel comprises a first conductive trace, a second conductive trace, and a third conductive trace; wherein
 each of the two third sub-display regions comprises k light-emitting element groups, wherein each of the k light-emitting element groups comprises a plurality of columns of adjacent second light-emitting elements, and a first light-emitting element group to a $k^{th}$ light-emitting element group are sequentially arranged in a direction going towards the other third sub-display region, k being an integer greater than 0; and
 each of the two target sub-display regions comprises k pixel circuit groups in one to one correspondence with the k light-emitting element groups, wherein each of the k pixel circuit groups comprises a plurality of columns of adjacent second pixel circuits, and a first pixel circuit group to a $k^{th}$ pixel circuit group are sequentially arranged in a direction going away from the adjacent third sub-display region; and the second light-emitting elements in each light-emitting element group are connected to the second pixel circuits in the corresponding pixel circuit group by the first conductive traces, the second conductive traces, and/or the third conductive traces in one-to-one correspondence.

8. The display panel according to claim 7, wherein the second light-emitting elements in the first light-emitting element group are connected to the second pixel circuits in the first pixel circuit group by the first conductive traces;
the second light-emitting elements in a second light-emitting element group are connected to the second pixel circuits in a second pixel circuit group by the second conductive traces;
the second light-emitting elements in a third light-emitting element group are connected to the second pixel circuits in a third pixel circuit group by the third conductive traces; and
the second light-emitting elements in a fourth light-emitting element group are connected to the second pixel circuits in a fourth pixel circuit group by one of the first conductive traces, the second conductive traces, and the third conductive traces.

9. The display panel according to claim 8, wherein each of the first conductive traces connected to the second light-emitting element in the first light-emitting element group, the second conductive trace connected to the second light-emitting element in the second light-emitting element group, and the third conductive trace connected to the second light-emitting element in the third light-emitting element group comprises a first conductive trace segment, a second conductive trace segment, and a third conductive trace segment; wherein
one end of the first conductive trace segment is connected to a corresponding second light-emitting element, and the other end of the first conductive trace segment is connected to one end of the second conductive trace segment;
the other end of the second conductive trace segment is connected to one end of the third conductive trace segment;
the other end of the third conductive trace segment is connected to a corresponding second pixel circuit; and
the first conductive trace segment and the third conductive trace segment extend in the first direction, the second conductive trace segment extends in the second direction, and an orthographic projection of the second conductive trace segment on the base substrate is at least partially overlapped with an orthographic projection of the second light-emitting element connected to the second conductive trace segment on the base substrate.

10. The display panel according to claim 9, wherein the second conductive trace segment in the first conductive trace is at least partially overlapped with the second conductive trace segment in the third conductive trace, the second conductive trace segment in the first conductive trace is not overlapped with the second conductive trace segment in the second conductive trace, and the second conductive trace segment in the third conductive trace is not overlapped with the second conductive trace segment in the second conductive trace.

11. The display panel according to claim 8, wherein the fourth light-emitting element group comprises two first sub-light-emitting element groups, two second sub-light-emitting element groups, and two third sub-light-emitting element groups symmetrically arranged along an axis of the third sub-display region, wherein each of the sub-light-emitting element groups comprises a plurality of rows of second light-emitting elements adjacent to each other, the first sub-light-emitting element group, the second sub-light-emitting element group, and the third sub-light-emitting element group disposed on a same side are sequentially arranged in a direction going away from the axis, and the axis extends in the second direction; and
the fourth pixel circuit group comprises two first sub-pixel circuit groups in one-to-one correspondence with the two first sub-light-emitting element groups, two second sub-pixel circuit groups in one-to-one correspondence with the two second sub-light-emitting element groups, and two third sub-pixel circuit groups in one-to-one correspondence with the two third sub-light-emitting element groups;
wherein the second light-emitting elements in each of the two first sub-light-emitting element groups are connected to the second pixel circuits in a corresponding first sub-pixel circuit group by the first conductive traces in one-to-one correspondence; the second light-emitting elements in each of the second sub-light-emitting element groups are connected to the second pixel circuits in a corresponding second sub-pixel circuit group by the second conductive traces in one-to-one correspondence, and the second light-emitting elements in each of the third sub-light-emitting element groups are connected to the second pixel circuit in a corresponding third sub-pixel circuit group by the third conductive traces in one-to-one correspondence.

12. The display panel according to claim 11, wherein each of the first conductive traces connected to the second light-emitting element in each of the two first sub-light-emitting element groups, the second conductive trace connected to the second light-emitting element in each of the two second sub-light-emitting element groups, and the third conductive trace connected to the second light-emitting element in each of the two third sub-light-emitting element groups comprises a fourth conductive trace segment, a fifth conductive trace segment, a sixth conductive trace segment, and a seventh conductive trace segment; wherein
one end of the fourth conductive trace segment is connected to a corresponding second light-emitting element, and the other end of the fourth conductive trace segment is connected to one end of the fifth conductive trace segment;
the other end of the fifth conductive trace segment is connected to one end of the sixth conductive trace segment;
the other end of the sixth conductive trace segment is connected to one end of the seventh conductive trace segment;
the other end of the seventh conductive trace segment is connected to a corresponding second pixel circuit;
the fifth conductive trace segment and the seventh conductive trace segment extend in the first direction, and the sixth conductive trace segment extends in the second direction, and the fourth conductive trace segment is disposed between a row of the connected second light-emitting element and an adjacent row; and
the fifth conductive trace segment in the first conductive trace is disposed in a region in which the second light-emitting element group to the fourth light-emitting element group are disposed, the fifth conductive trace segment in the second conductive trace is disposed in a region in which the third light-emitting element group and the fourth light-emitting element group are disposed, and the fifth conductive trace segment in the third conductive trace is disposed in a region in which the fourth light-emitting element group is disposed; and the sixth conductive trace segment on a side, distal from the second sub-display region, of the axis, is disposed on a side, distal from the second sub-display region, of the second display region, and the sixth conductive trace segment on a side, proximal to the second sub-display region, of the axis is disposed in the second display region proximal to the second sub-display region.

13. The display panel according to claim 7, further comprising a plurality of metal layers; wherein
 a data trace connected to each of the second pixel circuits and any of the plurality of metal layers are disposed in the same layer;
 wherein the plurality of metal layers comprise a first gate metal layer, a second gate metal layer, a first source-drain metal layer, and a second source-drain metal layer.

14. The display panel according to claim 13, wherein in the direction going away from the adjacent third sub-display region, in the first column to an $i^{th}$ column of second pixel circuits in each of the two target sub-display regions, a data trace connected to the second pixel circuits disposed in an odd-numbered column and the first gate metal layer are disposed in the same layer; a data trace connected to the second pixel circuits disposed in an even-numbered column and the second gate metal layer are disposed in the same layer, and a data trace connected to the $i^{th}$ column to an $n^{th}$ column of second pixel circuits and the first source-drain metal layer are disposed in the same layer, wherein i is an integer greater than 1 and less than n, and n is equal to a total quantity of columns in each of the two target sub-display regions; and a data trace connected to each second pixel circuit comprises a first data trace segment, a second data trace segment, and a third data trace segment; wherein
 one end of the first data trace segment is connected to a corresponding metal layer, the other end of the first data trace segment is connected to one end of the second data trace segment, the other end of the second data trace segment is connected to one end of the third data trace segment, and the other end of the third data trace segment is connected to the second pixel circuit; and
 the second data trace segment extends in the first direction, and the second data trace segment in the data trace in the same layer as the first gate metal layer, the second data trace segment in the data trace in the same layer as the second gate metal layer, and the second data trace segment in the data trace in the same layer as the first source-drain metal layer are not overlapped with each other.

15. The display panel according to claim 7, wherein in the same column of the second pixel circuits, the data trace connected to the second pixel circuits disposed in the first sub-display region is different from the data trace connected to the second pixel circuits disposed in the second sub-display region.

16. The display panel according to claim 1, wherein in the plurality of first pixel circuits and the plurality of second pixel circuits, a width of any pixel circuit is less than a width of any first light-emitting element.

17. The display panel according to claim 1, wherein the conductive trace is a transparent conductive trace.

18. A display device, comprising: an integrated circuit and a display panel comprising: a base substrate comprising a first display region and a second display region, wherein the first display region is at least partially disposed around the second display region, and the first display region comprises a first sub-display region and a second sub-display region sequentially arranged in a first direction; a plurality of first pixel circuits, a plurality of second pixel circuits, and a plurality of first light-emitting elements, wherein the plurality of first pixel circuits, the plurality of second pixel circuits, and the plurality of first light-emitting elements are disposed in the first display region, the plurality of second pixel circuits are disposed at intervals among the plurality of first pixel circuits, the plurality of first pixel circuits comprise a plurality of columns of first pixel circuits extending in the first direction, and the plurality of second pixel circuits comprise a plurality of columns of the second pixel circuits; a plurality of second light-emitting elements disposed in the second display region; at least one dummy column located in the second sub-display region of the first display region; and at least one column of dummy second pixel circuits, wherein the at least one column of dummy second pixel circuits is disposed in a target sub-display region proximal to the second display region, and the at least one column of dummy second pixel circuit is located between two adjacent columns of the first pixel circuits, wherein the first sub-display region comprises two symmetrical target sub-display regions; wherein at least one first pixel circuit of the plurality of first pixel circuits is connected to at least one first light-emitting element of the plurality of first light-emitting elements, an orthographic projection of the at least one first pixel circuit on the base substrate is at least partially overlapped with an orthographic projection of the at least one first light-emitting element on the base substrate, at least one second pixel circuit of the plurality of second pixel circuits is connected to at least one second light-emitting element of the plurality of second light-emitting elements by a conductive trace; at least one column of the plurality of columns of second pixel circuits extending in the first direction is located in a same column as the at least one dummy column, wherein the first direction is a direction intersecting with an extension direction of the conductive trace, wherein
 the integrated circuit is connected to a first pixel circuit and a second pixel circuit in the display panel, and is configured to drive the first pixel circuit and the second pixel circuit to operate.

19. The display device according to claim 18, wherein the display device further comprises a photosensitive sensor, wherein the photosensitive sensor is disposed in a second display region of the display panel.

20. The display device according to claim 19, wherein the second display region is rectangular, and an area of an orthographic projection of the photosensitive sensor on a base substrate is less than or equal to an area of an incircle of the second display region.

* * * * *